United States Patent
Ferrasse et al.

(10) Patent No.: US 11,359,273 B2
(45) Date of Patent: Jun. 14, 2022

(54) FRICTIONLESS FORGED ALUMINUM ALLOY SPUTTERING TARGET WITH IMPROVED PROPERTIES

(71) Applicant: Honeywell International Inc., Morris Plains, NJ (US)

(72) Inventors: Stephane Ferrasse, Spokane, WA (US); Suresh Sundarraj, West Richland, WA (US); Frank C. Alford, Spokane Valley, WA (US); Jeffrey J. Schaefer, Spokane Valley, WA (US); Susan D. Strothers, Mead, WA (US)

(73) Assignee: Honeywell International Inc., Charlotte, NC (US)

( * ) Notice: Subject to any disclaimer, the term of this patent is extended or adjusted under 35 U.S.C. 154(b) by 702 days.

(21) Appl. No.: 15/749,720

(22) PCT Filed: Jul. 26, 2016

(86) PCT No.: PCT/US2016/043997
§ 371 (c)(1),
(2) Date: Feb. 1, 2018

(87) PCT Pub. No.: WO2017/023603
PCT Pub. Date: Feb. 9, 2017

(65) Prior Publication Data
US 2018/0223420 A1    Aug. 9, 2018

Related U.S. Application Data

(60) Provisional application No. 62/200,337, filed on Aug. 3, 2015.

(51) Int. Cl.
C23C 14/34 (2006.01)
C22C 21/00 (2006.01)
(Continued)

(52) U.S. Cl.
CPC ............. *C23C 14/3414* (2013.01); *B21J 5/02* (2013.01); *C22C 21/00* (2013.01); *C22C 21/12* (2013.01); *C22F 1/057* (2013.01)

(58) Field of Classification Search
CPC .................. B21J 3/00; C22C 21/00
See application file for complete search history.

(56) References Cited

U.S. PATENT DOCUMENTS 4,626,409 A   12/1986   Miller
4,869,751 A    9/1989   Zedalis et al.
(Continued)

FOREIGN PATENT DOCUMENTS

CN   101374611 A   2/2009
CN   101801565 A   8/2010
(Continued)

OTHER PUBLICATIONS

Singaporean Search Report and Written Opinion issued in SG Application No. 11201800859T, dated Jun. 19, 2019, 9 pages.
(Continued)

*Primary Examiner* — George Wyszomierski
*Assistant Examiner* — Janell C Morillo
(74) *Attorney, Agent, or Firm* — Faegre Drinker Biddle & Reath LLP

(57) ABSTRACT

A sputtering target comprising a forged aluminum material having an average grain size between about 15 and 55 microns. The aluminum material has at least one of the following: a homogeneous texture with minimal texture banding as measured by banding factor B below about 0.01; a texture gradient H of less than 0.2; or either weak (200) texture or near random texture characterized by maximum intensity of inverse pole figure less than 3 times random in multiple directions.

7 Claims, 18 Drawing Sheets

(51) Int. Cl.
*B21J 5/02* (2006.01)
*C22C 21/12* (2006.01)
*C22F 1/057* (2006.01)

(56) References Cited

U.S. PATENT DOCUMENTS

| | | |
|---|---|---|
| 5,087,297 A | 2/1992 | Pouliquen |
| 5,143,590 A | 9/1992 | Strothers et al. |
| 5,342,496 A | 8/1994 | Stellrecht |
| 5,400,633 A | 3/1995 | Segal et al. |
| 5,597,529 A | 1/1997 | Tack |
| 5,766,380 A | 6/1998 | Lo et al. |
| 5,807,443 A | 9/1998 | Masuda et al. |
| 5,809,393 A | 9/1998 | Dunlop et al. |
| 5,979,534 A | 11/1999 | Shibata et al. |
| 6,094,815 A | 8/2000 | Shigihara et al. |
| 6,238,494 B1 | 5/2001 | Segal |
| 6,348,139 B1 | 2/2002 | Shah et al. |
| 6,451,185 B2 | 9/2002 | Beier et al. |
| 6,517,954 B1 | 2/2003 | Mergen et al. |
| 6,569,270 B2 | 5/2003 | Segal |
| 6,698,647 B1 | 3/2004 | Kim |
| 6,849,139 B2 | 2/2005 | Kardokus et al. |
| 6,878,250 B1 | 4/2005 | Segal et al. |
| 6,946,039 B1 | 9/2005 | Segal et al. |
| 7,017,382 B2 | 3/2006 | Segal et al. |
| 7,767,043 B2 | 8/2010 | Segal et al. |
| 8,231,745 B2 | 7/2012 | Wickersham, Jr. et al. |
| 8,974,611 B2 | 3/2015 | Carpenter et al. |
| 2001/0001401 A1 | 5/2001 | Segal |
| 2001/0047838 A1 | 12/2001 | Segal et al. |
| 2003/0052000 A1 | 3/2003 | Segal et al. |
| 2004/0072009 A1 | 4/2004 | Segal et al. |
| 2005/0247386 A1 | 11/2005 | Matera et al. |
| 2005/0284746 A1 | 12/2005 | Ivanov |
| 2011/0302979 A1 | 12/2011 | Oppenheimer et al. |
| 2014/0271337 A1 | 9/2014 | Banik et al. |
| 2018/0094340 A1 | 4/2018 | Ferrasse et al. |

FOREIGN PATENT DOCUMENTS

| | | |
|---|---|---|
| CN | 103255381 A | 8/2013 |
| CN | 104451566 A | 3/2015 |
| EP | 0370211 A2 | 5/1990 |
| EP | 0881311 A1 | 12/1998 |
| EP | 2706129 A1 | 3/2014 |
| GB | 2276429 A | 9/1994 |
| JP | 60148651 A | 8/1985 |
| JP | 6226426 A | 8/1994 |
| JP | 2001295040 A | 10/2001 |
| JP | 2014214827 A | 11/2014 |
| JP | 2015096647 A | 5/2015 |
| JP | 2015183244 A | 10/2015 |
| KR | 865658 B1 | 10/2008 |
| KR | 20120135546 A | 12/2012 |
| KR | 20140015367 A | 2/2014 |
| KR | 101499096 B1 | 3/2015 |
| TW | 200801214 A | 1/2008 |
| WO | WO9902743 A1 | 1/1999 |
| WO | WO0073531 A2 | 12/2000 |
| WO | WO0194659 A2 | 12/2001 |
| WO | 2005094280 A2 | 10/2005 |
| WO | 2017014990 A1 | 1/2017 |

OTHER PUBLICATIONS

Ahmad, Zaki. "The Properties and Application of Scandium-Reinforced Aluminum." Journal of the Minerals, Feb. 2003, pp. 35-39.

Berezina, A.L.; et al. "A Comparative Analysis of Effectiveness of Al3Sc and Al3Zr Species in Al-Mg Alloys." Met. Phys. Adv. Tech., 17:1021-1034, 1999.

Du, Gang; et al. "Coarsening Behavior of Al3(Sc,Zr) Precipitates and Its Influence of Recrystallization Temperature of Al-Mg-Sc-Zr Alloy." J. Mater. Sci. Technol., 25(6)749-752, 2009.

Ferrasse, S.; et al. "Texture Evolution During Equal Channel Angular Extrusion Part I. Effect of Route, Number of Passes and Initial Texture." Materials Science and Engineering A, 368:28-40, Mar. 15, 2004.

Ferrasse, Stephane. "Development of a Submicrometer-Grained Microstructure in Aluminum 6061 using equal channel Angular Extrusion." Journal of Materials Research, 12(5):1253-1261, May 1997.

Ferrasse, Stephane; et al. "Microstructure and Properties of Copper and Aluminum Alloy 3003 Heavily Worked by Equal Channel Angular Extrusion." Metallurgical and Materials Transactions A, 28A:1047-1057, Apr. 1997.

Ferrasse, Stephane; et al. "Scale Up and Application of Equal-Channel Angular Extrusion for the Electronics and Aerospace Industries." Materials Science A, 493:130-140, Oct. 15, 2008.

International Preliminary Report on Patentability issued in PCT/US2016/043997, dated Feb. 15, 2018, 10 pages.

International Search Report and Written Opinion issued in PCT/US2016/043997, dated Jul. 26, 2016, 14 pages.

International Search Report and Written Opinion issued in PCT/US2017/052217, dated Jan. 10, 2018, 14 pages.

Kaibyshev, Rustam. "Mechanism of Low-Temperature Superplastic Deformation In Aluminum Alloys Containing A Dispersion of Nanoscale Al3(Sc,Zr) Particles." Materials Science Forum, 838-839:150-156, 2016; International Conference on Superplasticity in Advanced Materials, ICSAM 2015.

Kim, Jong Ho; et al. "Electromagnetic Continuous Casting Process for Near Net Shape Aluminum Alloy Billet." Materials Science Forum, vols. 654-656:1400-1403, 2010.

Kim, W.J.; et al. "Forging of Mg-3Al-1Zn-1Ca Alloy Prepared by High-Frequency Electromagnetic Casting." Materials and Design, 30:4120-4125, 2009.

Qu, Fu; et al. "Effects of Electromagnetic Field and Lubricate Condition on the Surface Quality of Aluminum Alloy Billet During LFEC Processing." Applied Mechanics and Materials, vols. 268-270:378-381,2013.

Vlach, M; et al. "Microstructure, Thermal and Mechanical Properties of Non-Isothermally Annealed Al-Sc-Zr and Al-Mn-Sc-Zr Alloys Prepared by Powder Metallurgy." Acta Physica Polonica A, 122(3):439-443, 2012.

Yoneta; et al. "Advantageous Characteristics of Graphite Free Forging Lubricants to Environmentally Friendly Work Space." 2009 STLE Annual Meeting & Exhibition; May 17-21, 2009; Disney's Coronado Springs Resort; Orlando, Florida, USA; pp. 264-266.

Yuzbekova, Diana; et al. "Superplasticity of Ultrafine-Grained Al-Mg-Sc-Zr Allow." Materials Science & Engineering A 675:228-242,2016.

Extended European Search Report issued in EP Application 16833529.7, dated Dec. 6, 2018, 11 pages.

X R Li et al., "Effects of thermomechanical processing on the recrystallization texture and grain size of Al-1%Si sputtering target material", IOP Conference Series: Materials Science and Engineering, vol. 82, Apr. 24, 2015, 012065, 5 pages.

Color coded orientation map - sample 52.5% FF

Color coded orientation map - sample 74% FF $Q_1$ : pôle du plan $(e_2, e_3)$ - plan (001)

$P_1$ : pôle du plan $(e_1, e_2)$ - plan (001)

FRICTIONLESS FORGED ALUMINUM ALLOY SPUTTERING TARGET WITH IMPROVED PROPERTIES

CROSS-REFERENCE TO RELATED APPLICATION

This application is the U.S. national stage of PCT/US2016/043997, published as WO 2017/023603, filed Jul. 26, 2016, which claims the benefit under Title 35, U.S.C. § 119(e) of U.S. Provisional Patent Application Ser. No. 62/200,337, filed Aug. 3, 2015, the disclosures of each of which are hereby incorporated by reference herein in their entirety.

TECHNICAL FIELD

The present disclosure relates to sputtering targets, methods of forming sputtering targets, and methods of forming sputtering targets having uniform microstructures. More particularly, the present disclosure relates to aluminum articles with fine uniform microstructures and textures and methods of making the same.

BACKGROUND

Currently available aluminum and aluminum alloy sputtering targets are processed by standard casting followed by significant rolling, and then followed by bonding the target to a backing plate. Potential challenges associated with manufacturing sputtering targets include cast defects, such as feather grains that cannot be broken down by rolling, inclusions, pores, shiny spots on the target surface, and non-uniform metallurgy. Further examples include inconsistent grain sizes throughout the cast billet and from target to target, and non-uniform texture throughout the target thickness. Non-uniform texturing can potentially result in the formation of local bands of grain sizes with different texture and sputtering properties, a phenomenon referred as texture banding.

One potential constraint in rolling as a mechanical operation is that it does not always produce uniform deformation, especially in cylindrical billets having a large height h to diameter D (h/D) ratio, which may perpetuate or cause defects in grain size or texture.

SUMMARY

Disclosed here in is a sputtering target comprising a forged aluminum material having an average grain size between about 15 and 55 microns. The aluminum material has at least one of the following: a homogeneous texture with minimal texture banding as measured by banding factor B below about 0.01; a uniformity factor or texture gradient H of less than 0.2; or either weak (200) texture or near random texture characterized by maximum intensity of inverse pole figure less than 3 times random in multiple directions.

Also disclosed herein is a method of forming an aluminum material with uniform grain size for use with a sputtering target. The method comprises placing a sheet of solid lubricant at an interface between the aluminum billet and the press plates of a forging press; forging the aluminum billet to at least a 50% reduction in height; and rolling the aluminum billet to at least a 35% reduction in height.

Also disclosed herein is a method of frictionless forging an aluminum material. The method comprises placing at least one sheet of graphite at an interface between an aluminum billet and the press plates of a forging press; and forging the aluminum billet to at least a 50% reduction in height while maintaining the aluminum material at less than 100° C.

While multiple embodiments are disclosed, still other embodiments of the instant disclosure will become apparent to those skilled in the art from the following detailed description, which shows and describes illustrative embodiments of the instant disclosure. Accordingly, the drawings and detailed description are to be regarded as illustrative in nature and not restrictive.

DETAILED DESCRIPTION

Figure 1:
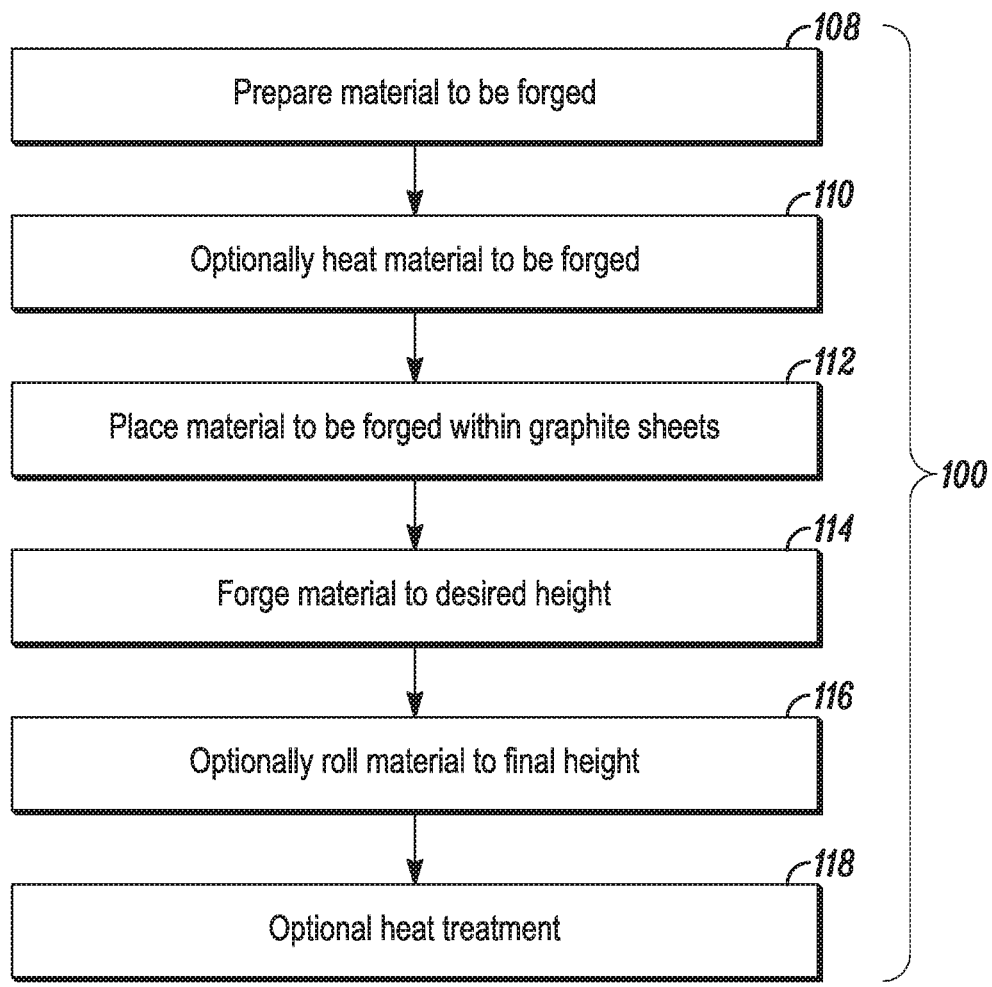
FIG. 1 is an exemplary flow diagram of a method of the current disclosure.

The present disclosure provides a method for producing a sputtering target that has a uniform microstructure. Also disclosed is a method that includes using a frictionless forging process for a height reduction followed by optional rolling. The frictionless forging process may be used to reduce a material height of a target blank by at least 50 percent.

In some embodiments, the present disclosure provides a sputtering target having a forged aluminum material having an average grain size between about 15 and 55 microns, and at least one of the following: a homogeneous texture with minimal texture banding as measured by banding factor B below about 0.01, and a uniformity factor H (also referred to as a texture gradient) of less than 0.2. In some embodiments, the present disclosure provides a sputtering target having a forged aluminum material having an average grain size between about 20 and 45 microns, between about 25 and 40 microns, between about 30 and 35 microns, and any value within these ranges.

In one aspect, the present disclosure provides a casting method that inhibits the creation of texture banding in a metallurgical product and provides suitable texture homogeneity. As used herein, the phrase texture banding refers to the occurrence of non-uniformity in the microstructure consisting of groups of grains that have a different crystallographic texture orientation and strength compared to surrounding grains. These groups of grains often form long bands throughout the material thickness; this phenomenon is referred to as "texture banding". Texture bands generally contain grains that are larger in size than the grains in the reminder of the material. Texture bands are one of the main contributors to heterogeneity in the material texture and lead to strong gradients in orientation through a material thickness. Texture bands are often seen in samples that have been rolled (especially at low reductions) and subsequently recrystallized. Bands also tend to appear toward the center of the billet due in part to the heterogeneity of deformation. In another aspect, the present disclosure provides a method of reducing the creation of localized bands of grain sizes with varying texture in a sputtering material. Methods of the present disclosure may be used to avoid introducing certain defects that are detrimental to sputtering properties introduced by certain casting technology.

In some embodiments, the present disclosure includes a method of forging that reduces friction between the contacting surfaces of the material being forged and the forging device during a forging process. The present disclosure also reduces the amount of rolling used when processing a sputtering material by replacing rolling with a new processing technique for forging that provides more uniform deformation.

In some embodiments, the present method includes performing a forging step as frictionless upsetting to provide stress-strain uniformity followed by intensive working without material cracking and press over-loading. In some embodiments, the present method includes performing a forging step at temperatures below the minimum temperature of static recrystallization to provide a fine uniform structure or texture. In some embodiments, the present method includes a frictionless forging step, followed by rolling and an optional annealing step. The steps of forging, rolling and annealing can be optimized to provide cost-effective processing and improve sputtering target performance.

In some embodiments, the methods disclosed herein use a frictionless forging step in combination with an additional processing step to create a material having a homogenous grain structure and consistent texture gradient. As used herein, the term texture gradient refers to a metric describing the level of homogeneity and heterogeneity that a texture exhibits within a particular area. An additional metric, referred to as a banding factor, denotes the degree to which a material consists of alternating bands of varying grain sizes and texture.

Figure 16:
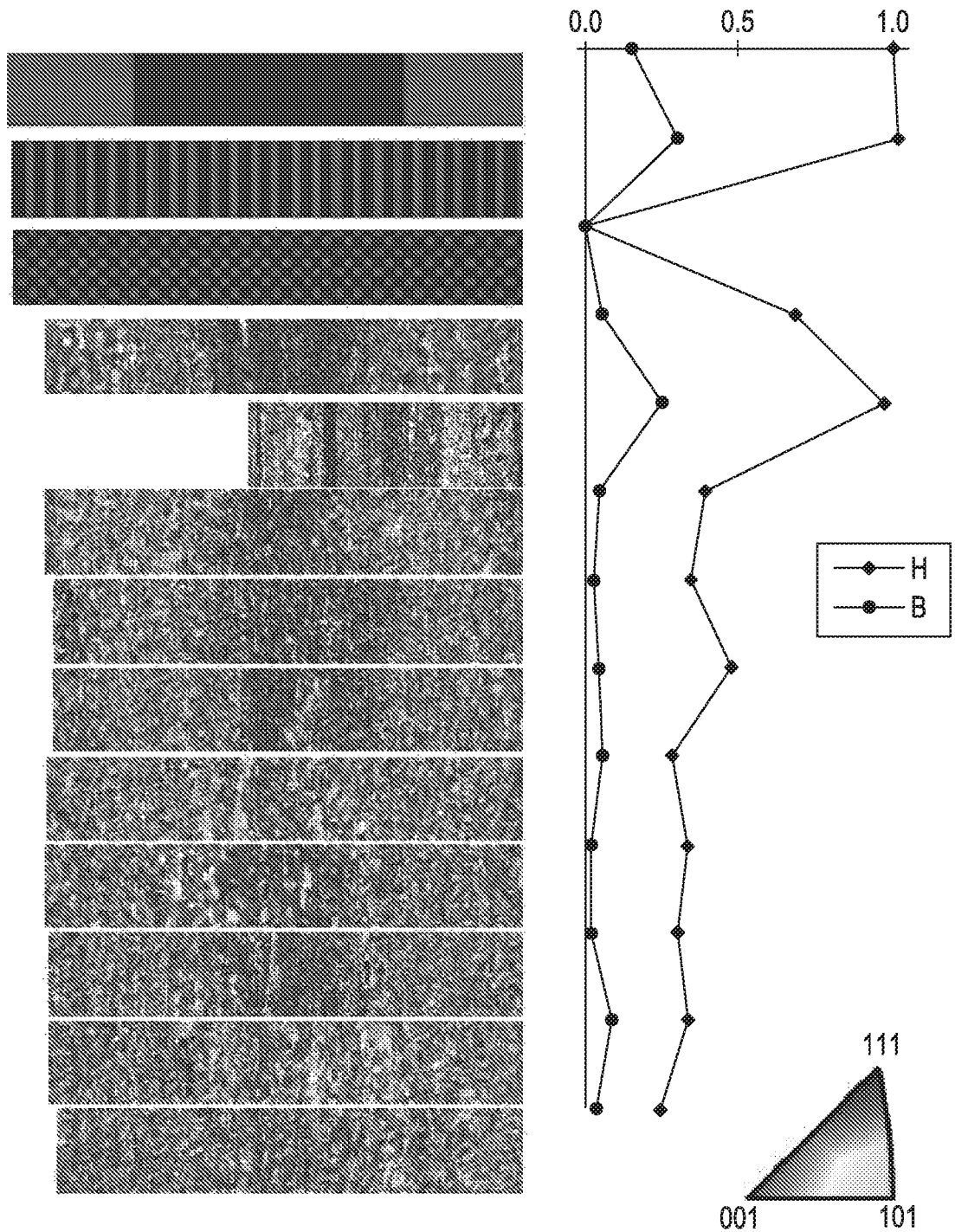
FIG. 16 is an image illustrating the numerical definition of the banding factor B and the heterogeneity H of a metallurgical material.

As a measurement tool, electron back scatter detection ("EBSD") can be used to give quantitative data on the uniformity of grain size and texture. One measure of uniformity is the banding factor ("B"). B gives a measurement of the extent to which the local texture consists of alternating bands. As illustrated in FIG. 16, the B value ranges between 0 and 0.5. A value of 0 denotes no banding, whereas a value of 0.5 would describe an extremely banded material having structures consisting of alternating bands of large grains with different texture. Another measurable parameter is the uniformity factor ("H") (also referred to as a texture gradient) and is a metric describing how homogeneously/heterogeneously the local texture is distributed within the scan area. H ranges in value of 0 for a perfectly homogenous distribution of the texture to 1 for a heterogeneous structure. The mathematics for carrying out these calculations and the image contained in FIG. 16 are provided in Stuart L. Wright & David P. Field, *Scalar Measurements of Texture Homogeneity*, Materials Science Forum Vols. 495-497 (2005) pp. 207.

To measure the effects of the methods disclosed herein, the measure of the banding factor B and uniformity factor or texture gradient H were calculated using electron backscatter diffraction (EBSD) technique. EBSD is a microstructural-crystallographic characterization technique that may be used to study any crystalline or polycrystalline material. The technique involves understanding the structure, crystal orientation and phase of materials. The equipment used for EBSD was a Philips XL30 Field Emission Scanning Electron Microscope (FESEM) equipped with an EDAX EBSD system and EDAX EBSD Hikari camera. The data acquisition software was TSL EDAX OIM which includes a mathematical routine to calculate both the uniformity factor H and banding factor B.

The procedure used to calculate H and B is as follows. First, the sample is scanned line by line through a thickness of the sample. For each column or line of data points in the scan grid, the software calculates the average deviation in alignment of a prescribed crystal direction with the sample normal, also referred to as a pole (defined further below). In effect, it is possible to plot a curve showing the pole deviations through the sample thickness. Mathematically, the pole scalar function $\omega^h_{,y}(\delta)$ describes the average angular deviation of a given pole (crystal orientation), h, from a given sample direction, y, as of function of depth ($\delta$).

Two scalar measures of texture uniformity can then be derived from the pole deviation plots. H defines the severity of a texture gradient and B parameterizes the degree of textural banding. H is the first derivative of the pole density function $\omega^h_{,y}(\delta)$. It is termed the uniformity factor or texture gradient. It describes the change in average orientation as a function of thickness and indicates local variations in texture and therefore is essentially a texture gradient function. If the texture is homogeneous, then local variations are small and H is near 0 (it is a derivative of a constant function in that case). If, on the other hand, the material alternates constantly (scanned line by scanned line) from one type of texture to the other then H is large; the maximum value of H has been normalized to be 1. The mathematical expression of H is given in equation 1.

$$H = 1/t \int_0^t \frac{dw}{d\delta} d\delta \tag{1}$$

Where t is the thickness of the sample,
w is the pole scalar function, and
δ is the depth (i.e. the location of a given scan line).

The second measure, B, is calculated from the second derivative of the pole deviation function. B may be calculated using equation 2.

$$B = \Delta\delta 1/t \int_0^\tau \frac{d2w}{d\delta 2} d\delta \qquad (2)$$

where Δδ is the distance between lines (rows or columns) of scan data, and B is the cumulative inflection in pole deviation per unit length, and is, thus, a measure of texture banding in the material.

In some embodiments, the present methods have the potential to remove certain casting defects such as feather grains. It also has the potential to eliminate bands of large grains with differing texture, which may occur when using rolling alone.

Traditional forging devices often introduce an area of no material flow, or limited material flow at the center of the interface between the material being forged and the forging plates. This area of limited material flow, often referred to as a dead zone, will generally have an area where the material being forged is in constant contact with the forging plates during forging.

Frictionless forging ("FF") is a type of upset forging where almost no friction is present at the interfaces of the material being forged and the forging device, i.e. the forging device plates. One advantage of using FF is that it allows the surfaces of the material being forged that are in contact with the forging plates to slide along the surfaces of the forging plates, thus eliminating this dead zone. As a result, FF provides a uniform strain distribution throughout the material being forged. This results in the material having a homogenous structure (i.e. consistent grain size and texture) and reduces the formation of grains of varying sizes. Having a consistent grain size throughout the material improves its usefulness, and provides an advantage in the manufacture of sputtering targets.

In some embodiments, frictionless forging may include placing two, preferably thin, sheets of solid lubricant between the surfaces of the material to be forged and the forging plates. It has been found that suitable results are achieved using lubricant polymers that exhibit visco-elastic behavior at working conditions or carbon based lubricants such as graphite. The use of graphite may also be advantageous as it eliminates the need for machined pockets at the faces of billets. One form of graphite that may be used is a sheet of graphite tape sold under the trade name Grafoil®, available from GrafTech International, located in Independence, Ohio.

In some embodiments, a graphite sheet with a width substantially larger than that of the material to be forged may be used. Using a sheet of graphite that has a greater width than the material to be forged provides continuing lubrication as the material to be forged increases in width during the forging process. This method is generally advantageous as it provides suitable coverage between the forging plates and the material that is being forged throughout the entire forging process. It is known that an indent or pocket may be formed on at least one of the surfaces of the material to be forged. Generally, a pocket may be formed at the surfaces that are in contact with the plates of the forging machine. For example, a pocket can be placed adjacent to the flat planar surface as discussed in U.S. Pat. No. 6,569,270. However, using a solid lubricant that is wider than the material to be forged optionally removes the need to machine a pocket in the surface of the material to be forged.

It has been found that several parameters of a FF process can be optimized to improve the material produced with the methods disclosed here. Some parameters that may be controlled include percent thickness reduction (total amount of strain), process temperature, and strain rate (i.e. forging speed).

In some embodiments, the forging speed, which directly affects the strain rate, can be optimized to provide uniformity in the final product. For example, a higher forging speed and greater strain rate may contribute to a better grain size uniformity. An optimized strain rate can also create smaller grain sizes, especially in cases when dynamic recrystallization is needed, for example, when high temperatures are used. In some instances, the strain rate has minimal effect when low temperatures are used, i.e. the material is undergoing static recrystallization.

The process temperature can also be optimized. In some embodiments, the process temperature can be controlled to improve the final product in two different ways. In the first example, the temperature may be controlled to remain below the static recrystallization temperature of a given alloy if static recrystallization heat treatment is desired. In the second example, the temperature used may be allowed to increase just above the static recrystallization temperature if dynamic recrystallization is desired, i.e. the grains deform and recrystallize at the same time during FF forging.

An example temperature range for dynamic recrystallization for aluminum or aluminum alloys is between about 300° C. and 350° C. Dynamic recrystallization is preferred for certain applications, in particular for the elimination of feather grains. However, it has been discovered that for high purity, low alloyed aluminum alloys such as LC5 Al0.5Cu the grain size obtained after dynamic recrystallization may be too large for sputtering targets, often over 55 microns.

For the percent thickness reduction, the upper limit is fixed by the maximum load attainable with a given forging press as well as the ductility of a given material, that is, its ability to deform without cracking. As a material is forged it becomes wider and thinner, i.e. the height to diameter ("h/D") ratio decreases, and the load increases. In some materials, this may result in crack formation at certain loads.

Another process parameter that may be optimized is the temperature of an optional heat treatment step after forging and/or rolling. In some embodiments, a heat treatment step may be used alone following forging and/or rolling. In some embodiments, a heat treatment step may be combined with a bonding step, for example diffusion bonding. In addition to optimizing a temperature used in a heat treatment step, it is also possible to optimize the time the material undergoes a heat treatment step.

The effect of temperatures corresponding to those used in diffusion bonding has been studied. For example, sputtering targets are often diffusion bonded to a backing plate by subjecting them to elevated temperatures, typically around 250° C. to 300° C., for 1 to 2 hours. The time and temperature parameters of diffusion bonding are thus equivalent to subjecting the material to an annealing treatment. It has been discovered that it may be advantageous to FF material at room temperature to obtain suitable results. The room temperature FF may be followed by a heat treatment step at 250° C.-350° C. Using high FF temperature to dynamically recrystallize material is often not the most suitable method when working with aluminum alloys as material characteristics such as grain size and uniformity degrade during subsequent heat treatment or bonding at 250° C.-300° C. It is generally advantageous to combine FF forging with rolling, in order to achieve a finer structure after a separate heat treatment at 250° C.-300° C.

Optimal processing parameters for the above disclosed steps have been found. Used in combination, these parameters may be used to create a material having suitable grain size distribution and texture homogeneity.

Frictionless forging may be used alone to produce sputtering materials having fine and uniform grain sizes. However, when processing aluminum alloys, the percent height reduction often has to be greater than 70%, which may require high loads when using a FF step alone. In many cases the loads required to achieve a 70% height reduction using FF alone on an aluminum material are too high to achieve the final material thickness. One solution is to perform a rolling step after the FF step. It has been discovered that while rolling has advantages in terms of grain refinement, a rolling step may not be suitable for more than an 80% total height reduction in the final product because it may detrimentally affect texture and grain size uniformity. In some embodiments, a suitable combination of FF and rolling can include FF to a percent height reduction between about 40% to about 75% followed by rolling to achieve between 30% to about 80% height reduction. Rolling is generally performed along multiple rolling directions. In some embodiments, 2, 4, or 8 directions are often used. For example, for 2 rolling directions, an aluminum billet is rolled first perpendicular to the roll and then rotated 90 degrees about the axis perpendicular to the billet surface for the next rolling pass. For each subsequent rolling pass, the billet is progressively rotated another 90 degrees about the axis perpendicular to the billet before performing the next rolling pass. As another example, for 4 and 8 directions, the billet is progressively turned by 45 degrees and 22.5 degrees respectively between each rolling pass (with the first pass often done perpendicularly to the rolls of the rolling mill).

In some embodiments, the h/D ratio may be less than 0.5 after a FF step so that the rolling is carried out on already sufficiently thin plates. This allows a user to limit the total rolling deformation. The lower limit of the percent thickness reduction is fixed by the minimum total strain needed to achieve a fine enough grain size upon further heat treatment. For example, the percent thickness reduction during the FF step may be at least 70% if only FF is used. The percent thickness reduction during the FF step may be greater than 50% if a rolling step is used after FF. As used herein, the term percent height reduction is the difference between the height of the material at the start of that processing step, and the height of the material when that step is done divided by the height of the starting material. In some embodiments, the percent height reduction may be as low as 40%, 45%, or 50%, or as high as 70%, 72.5%, or 75%, or may be within a range delimited by a pair of the foregoing values, such as 40% to 75%, 45% to 72.5%, or 50% to 75% etc.

In some embodiments, the instant disclosure provides a bonded sputtering target/backing plate assembly, with the target formed of a high purity Al alloy. In particular, the target may comprise at least 99.999% (5N) purity aluminum combined with at least one or more of the following alloying elements: Cu, Si, Ti, Nd, Sc, Zr, Mn, or Mo. Alloying elements may be present at weight percentages as low as 0.05, 0.75, or 0.1 or as high as 7.5, 9.0, or 10.0, or may within a range delimited by a pair of the foregoing values, such as between about 0.05% and 10%, 0.75% and 9.0% or 0.1% and 7.5%.

In some embodiments, an aluminum material may be created having an average grain size greater than 0.5 microns but less than 55 microns, less than 45 microns, or less than 40 microns as measured using optical microscopy. In other words, the final product would not contain bands of material containing grains larger than 55 microns. In some embodiments, the grain size can be measured to quantify the texture or uniformity of the structure as measured by electron back scatter diffusion ("EBSD"). As measured using EBSD, the banding factor B may be less than 0.01, less than 0.005, or less than 0.0025.

In some embodiments, the methods of the instant disclosure may be used to form an aluminum material having a uniformity factor H of less than 0.20, less than 0.15, less than 0.12, or less than 0.10. In some embodiments, the methods of the instant disclosure may be used to create a material with texture strength less than 3 times random ("t.r."), as measured by max intensity of pole figure and inverse pole figures during EBSD. During EBSD, the intensity of the diffracted electron beam for all crystallographic planes of the scanned area can be graphically represented in pole figure and inverse pole figure (this is described further below). The stronger the intensity for a given crystallographic plane, the more grains that possess this particular crystallographic orientation, and, therefore, the more it is predominant. Intensities are often measured as multiples of times random (t.r.), for example 1 times random, 2 times random etc.

The EBSD equipment is originally and periodically calibrated with a random sample that gives an intensity of 1 times random. A random sample is usually a specially prepared powder sample that has a grain population that exhibits a random distribution of crystal orientations (i.e. no single crystal orientation dominates, meaning that there is roughly an equal number of grains containing a particular crystallographic orientation along the measured plane). Typically, max intensity values for a pole figure or an inverse pole figure between 1 and 3 t.r correspond to weak texture, values between 3 and 6 t.r. to medium textures and values over 6 t.r. and, especially over 10 t.r., to strong or very strong textures where a few main orientations dominate.

The values for the strengths can be measured along specific planes defined by their Miller indices. For example it is possible to have a weak (200) plane or weak (111) plane displayed in inverse pole figure or pole figure. What this indicates is that the max intensity measured will be typically less than 3 t.r. in both cases, the difference being that in one case a slightly higher number of grains have their (200) crystallographic plane parallel to the external measured reference plane whereas in the other case there is a slightly higher number of grains will have a (111) orientation. That is, there are a slightly higher number of grains with a (111) orientation compared to a perfectly random distribution.

Figure 14:
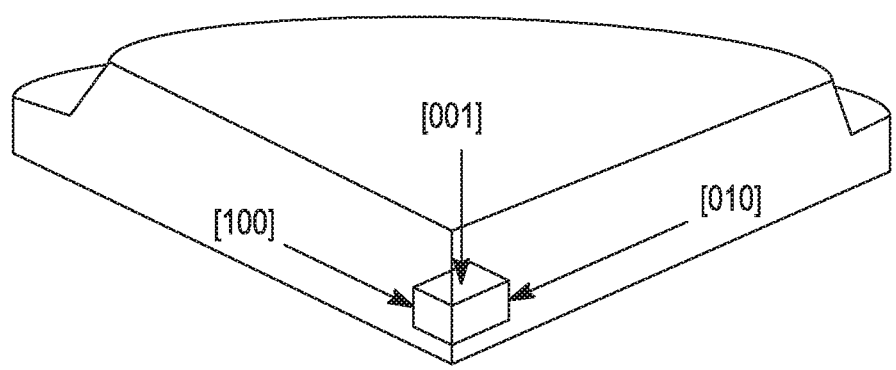
FIG. 14 shows the relationship between three planes where the pole figures and inverse pole figures are measured with respect to a sputtering target.

In some embodiments, the instant disclosure may be used to create a material having a texture orientation that is random or preferentially weak (200) in all directions. The term all directions, means looking not only at the plane parallel to the top face of the sputtering target but two planes perpendicular to the top surface and going through the target thickness as well. As shown in FIG. 14, a schematic of the cross-section of a sputtering target is shown to define the external reference planes whose direction is [001], [100], [010] for a sample in relation to the sputtering target shape.

In some embodiments, the instant disclosure may be used to create a material having a texture orientation that is random or preferentially weak (200) in all directions. For example, (200) is the Miller index for the plane meaning that the (200) plane of the corresponding grain lattice is parallel to the physical surface observed. For polycrystals with multiple grains, that means that a majority of grains will have their (200) crystallographic plane parallel to the surface physically measured in all directions (or equivalently planes since directions are perpendicular to planes). This means that when looking not only at the plane parallel to the top face of the target but also at any plane perpendicular to the top plane and going through the target thickness, it will be found either that grain orientations are mostly randomly distributed (no particular orientation dominates) or that there is a slightly higher population of grains with a (200) orientation resulting overall in a weak (200) texture. A weak (200) will have more (200) planes compared to what would be found in a sample that has a random texture as detected by intensity of pole or inverse pole figures, but not more than 3 t.r.

FIG. 1 illustrates one embodiment of a method using the steps of the instant disclosure. As shown in FIG. 1, in an exemplary method, an aluminum or aluminum alloy billet of a given composition is first prepared in step 108. This may include casting the material to a particular size and/or shape, and optionally a surface treatment. In some embodiments, the aluminum or aluminum alloy is cast into a cylinder having a material height h to diameter D ratio between about 0.75 and 3.0. Using this ratio may be helpful to limit loads on a forging apparatus and make the FF operation easier to carry out. In some embodiments, an "as cast" material can be used. In other words, no particular machining of the material to be forged is required following casting. For example, no machined pocket at the top and bottom face of material to be forged is required when using a carbon-based sheet such as a sheet of graphite, as discussed above. In step 110, the material to be forged may optionally be heated, or the material may be left at room temperature.

The material to be forged is placed on the forging apparatus in step 112. In some embodiments, the parameters for a FF step preferentially include using graphite sheets between the material to be forged and the forging plates. As previously disclosed, it has been found to be advantageous to have the diameter of the graphite sheets substantially larger than the diameter of the billet. In some embodiments, a 12-14 inch wide graphite sheet may be used for a 7.5 inch wide material to be forged. This allows the graphite to cover most of material surface as forged material gets larger and thinner during a forging step. It has been found that this configuration provides some advantages over the currently used techniques. It should be noted that the graphite sheets should be thick enough in order for them not to break, while still providing the best lubrication. A typical thickness for a graphite sheet is between about 0.01 inches and 0.1 inches thick. Another option is to place insulation around the material to be forged. This may aid in maintaining a constant temperature during the forging step.

In step 114, the material is subjected to a forging process. A suitable operating temperature for FF has been found to be about room temperature. Often a slightly elevated temperature, for example less than 200° C., is the next best option if forging at room temperature is not possible. The FF process may be controlled to remain below time and temperature conditions that correspond to static recrystallization for the material being forged.

The percent height reduction during a FF step may be controlled to between about 40% and 75%. As disclosed above, seeking greater percent height reduction from a forging step alone may result in damage to the forging equipment or induce cracking of the material. During the forging step, a slightly elevated temperature is possible but optional. For aluminum alloys, an intermediate temperature range may be from about 50° C. to about 250° C., i.e. lower than the temperature of static recrystallization.

In some embodiments, following the FF step, a rolling step (step 116) may be used to further reduce the height of the material. In some embodiments, rolling may include a percent height reduction between about 30% and 80%. Rolling may be carried out multi-directional, for example 2, 4, 8 or 16 directions as described above.

As shown in step 118, after the material has been brought to the desired height it may be further processed using for example a heat treatment step. In some embodiments, a heat treatment step may include annealing. In some embodiments a heat treatment step may be combined with, or be a feature of, a bonding step for diffusion bonding the target to a backing plate. For a heat treatment step, an example time and temperature range is about 250° C. to 300° C. for 1 to 2 hours.

It has been found that using the disclosed FF process, a forged material having a uniform strain distribution throughout the material can be produced. This process can be applied to a number of applications involved in the manufacture of sputtering targets. The process has been found to produce a material with a finer and more uniform grain size throughout the billet, and bands of large grains with different texture are eliminated. In some embodiments, the disclosed process can also break down and potentially eliminate some casting defects such as pores or dendrites.

It has been shown that the disclosed process provides an advantage over rolling or forging alone. The results have been quantified using two parameters: banding factor B and uniformity factors H, and are measured using EBSD analysis to determine quantitatively the uniformity of texture. As shown in the examples below, at least these two factors can be used to illustrate that materials processed using FF methods have a better overall structural and textural uniformity.

EXAMPLES

The following non-limiting Examples illustrate various features and characteristics of the instant disclosure, which is not to be construed as limited thereto.

Example 1

Small Scale Frictionless Forging Experiments with Dynamic Recrystallization

Small scale frictionless forging experiments were conducted to determine the effect of FF temperature and percent reduction on conditions of dynamic recrystallization in Al0.5Cu.

An aluminum billet comprised of 99.9995% (5N) Al+0.5Cu was the starting material. The aluminum billed was 1 inch in outer diameter and had a 2 inch height. Grafoil® sheets (available from GrafTech International, located in Independence, Ohio) were used at the top and bottom of the aluminum billet. Some insulating material was wrapped around the outer diameter to limit thermal losses.

The goal of these small scale tests was to understand the importance of various critical parameters on the occurrence of dynamic recrystallization during forging. Dynamic recrystallization occurs when grains first deform but then recrystallize into new grains free of dislocations during deformation. The onset temperature for dynamic recrystallization is usually from about 0° C. to about 100° C. above the temperature range where the material begins to undergo static recrystallization. This is about 300° C. to about 400° C. for Al0.5Cu for example.

Two different percent height reductions were analyzed, the first sample underwent a 70% height reduction and the second sample underwent about an 85-90% height reduction. Additionally, the effects of various forging temperatures were analyzed, from room temperature up to 400° C. It can be seen from Table 1 that dynamic recrystallization occurs at FF temperature greater than 300° C. at an 80-85% reduction and greater than 350° C. for height reductions lower than 70%. Below these temperatures, the material is still mostly deformed. Except for Sample 4, the case of an 80-85% FF at 300° C., which yields a uniform 49.5 microns grain size, all other samples have too large grain size (greater than 150 microns) and, in some cases, a non-uniform grain size is present.

TABLE 1

Example 1 Parameters

| Sample | FF Percent Height Reduction | Forge Temp (° C.) | Mean Grain Size (microns) | Grain size uniformity |
|---|---|---|---|---|
| 1 | 85-90 | Room Temp | deformed | Poor |
| 2 | 85-90 | 250 | not fully recrystallized | Poor |
| 3 | 85-90 | 275 | not fully recrystallized | Poor |
| 4 | 85-90 | 300 | 49.5 | Good |
| 5 | 85-90 | 350 | 150 | Medium |
| 6 | 85-90 | 400 | 306 | Medium |
| 7 | 70 | Room Temp | deformed | Poor |
| 8 | 70 | 300 | not fully recrystallized | Poor |
| 9 | 70 | 350 | 322 | Medium |

This data shows that the process window (time, temperature) to get acceptable grain size by dynamic recrystallization is tight. It is limited to high reduction (greater than 80%) and temperatures within 50° C. of that of static recrystallization. This indicates that the process is suitable if it is tightly controlled in practice. In particular, high reductions will cause high loads on the forging equipment.

The effect of annealing after FF was analyzed to find the best parameters after dynamic recrystallization. For the annealing step, Sample 4 was used (an 85-90% FF reduction at 300° C., 49.5 microns grain size). The annealing results are shown in Table 2 and indicate that grain size and uniformity deteriorated during further annealing (heat treatment) up to a bonding temperature of about 300° C.

TABLE 2

Effect of Annealing on Example 1, Sample 4 Material

| FF Percent Height Reduction | Forge Temp (° C.) | Rolling Percent Height Reduction | Anneal Temperature (° C.) | Mean Grain Size (microns) |
|---|---|---|---|---|
| 85-90 | 300 | none | none | 49.5 |
|  |  | none | 250 | 67.9 |
|  |  | none | 275 | 58.3 |
|  |  | none | 300 | 62.95 |

Overall, these results show that dynamic recrystallization during FF of aluminum alloys may be difficult to achieve and implement practically and might not yield a sufficiently uniform grain size at temperatures corresponding to typical bonding conditions.

Example 2

Small Scale Effect of Annealing Temperature after Frictionless Forging with No Dynamic Recrystallization The same starting blank and experiment set-up used in Example 1 was used in Example 2. In this example, the effect of standard annealing was studied using the samples that were not dynamically recrystallized during FF at an 85-90% reduction. Referring to Table 1, these were Samples 1-3. An annealing time of one hour was used to best simulate diffusion bonding conditions.

Figure 2:
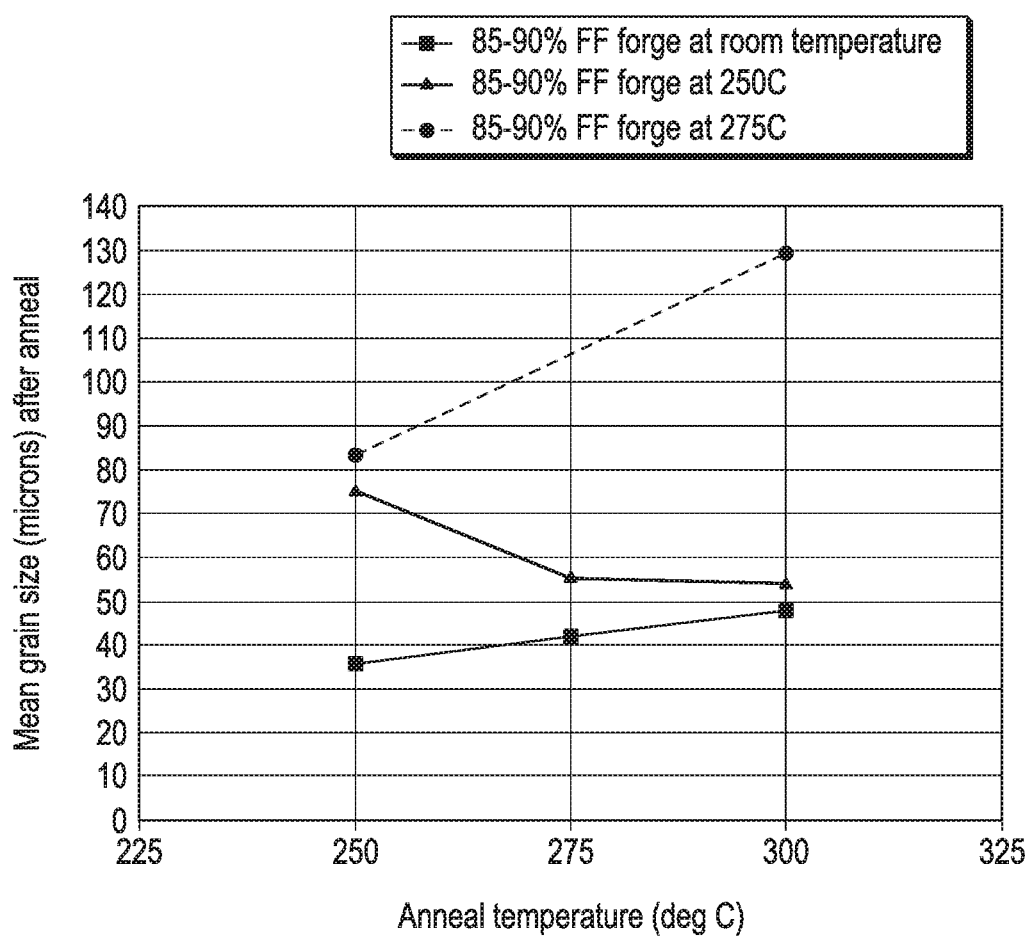
FIG. 2 is a graph showing the relationship of forging temperatures on grain size in a metal.

Table 3 and FIG. 2 illustrate the results for grain size and grain size uniformity. The best condition is when the samples are FF at room temperature (no pre-heating). In this case, grains of less than 50 microns and uniform sizes are obtained at temperatures corresponding to bonding a typical bonding step (i.e. 250° C.-300° C.).

TABLE 3

Effect of Annealing Temperature on Grain Size and Uniformity

| FF Percent Height Reduction | Forge Temp (° C.) | Anneal Temperature (° C.) | Mean Grain Size (microns) |
|---|---|---|---|
| 85-90 | Room Temp | none | deformed |
|  |  | 250 | 35.75 |
|  |  | 275 | 42 |
|  |  | 300 | 48 |
| 85-90 | 250 | none | not fully recrystallized |
|  |  | 250 | 75.31 |
|  |  | 275 | 55.75 |
|  |  | 300 | 54.45 |
| 85-90 | 275 | none | not fully recrystallized |
|  |  | 250 | 83.6 |
|  |  | 300 | 129.5 |

Example 3

Small Scale Effect of Rolling and Annealing after Room Temperature Frictionless Forging The same starting blank and experimental set up used in Example 1 were used. In this example, the effect of rolling after FF followed by heat treatment (annealing) using temperatures and process times approaching typical diffusion bonding parameters were evaluated.

Figure 3:
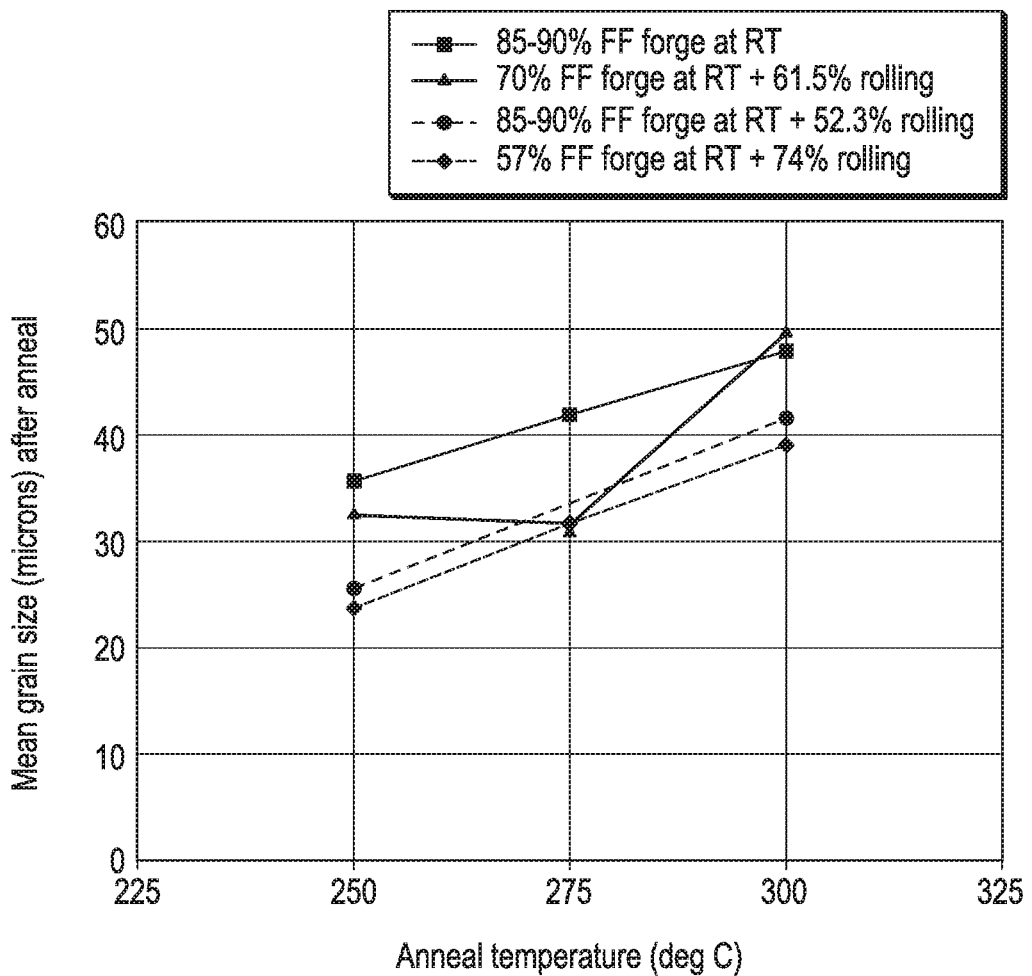
FIG. 3 is a graph showing the relationship of annealing temperatures on grain size in a metal.

First, as shown in Table 4 (and in FIG. 3 by comparing the curve with square dots with that of the round dots in FIG. 2), adding a moderate amount of rolling (here a 52.3% height reduction) has a positive effect as it leads to a decrease in grain size throughout the studied annealing range (250° C., 275° C. and 300° C.). The extra deformation due to rolling is responsible for this additional structural refinement, but is small enough not to affect uniformity.

TABLE 4

Effect of Rolling and Anneal Temperature on Frictionless Forged Material

| FF Percent Height Reduction | Forge Temp (° C.) | Rolling Percent Height Reduction | Anneal Temperature (° C.) | Mean Grain Size (microns) |
|---|---|---|---|---|
| 85-90 | Room Temp | 0 | none | deformed |
|  |  |  | 250 | 35.75 |
|  |  |  | 275 | 42 |
|  |  |  | 300 | 48 |
| 85-90 | Room Temp | 52.3 | none | deformed |
|  |  |  | 250 | 25.5 |
|  |  |  | 300 | 41.75 |
| 70 | Room Temp | 61.5 | none | deformed |
|  |  |  | 250 | 32.5 |
|  |  |  | 275 | 31.6 |
|  |  |  | 300 | 50 |
| 57 | Room Temp | 74 | None | deformed |
|  |  |  | 250 | 23.8 |
|  |  |  | 275 | 31.71 |
|  |  |  | 300 | 39.1 |

Second, as shown in Table 4 (and again in FIG. 3 by comparing the curve with square dots with that of the triangular dots in FIG. 2), it is possible to reduce the amount of FF to a 70% height reduction by using a moderate amount of rolling. For example, here a 61.5% height reduction was used (see the curve with triangular dots in FIG. 3), and a fine and uniform grain size was obtained, even for temperatures corresponding to those used for bonding (250° C.-300° C.). Third, as shown in Table 4 (and again in FIG. 3 by comparing the curve with square dots with that of the diamond dots in FIG. 2), it is possible to reduce the amount of FF to a 57% height reduction by using a moderate amount of rolling. For example, here a 74% height reduction was used (see the curve with diamond dots in FIG. 3), and a fine and uniform grain size was obtained, even for temperatures corresponding to those used in diffusion bonding (250° C.-300° C.).

FIGS. 4A-4E display the microstructures of samples that were FF at room temperature ("RT"), rolled, and annealed at 250° C. and 300° C., and compare some of the examples of an 85-90% and 70% FF sample with additional rolling, with examples made with FF alone.

Figure 4A:
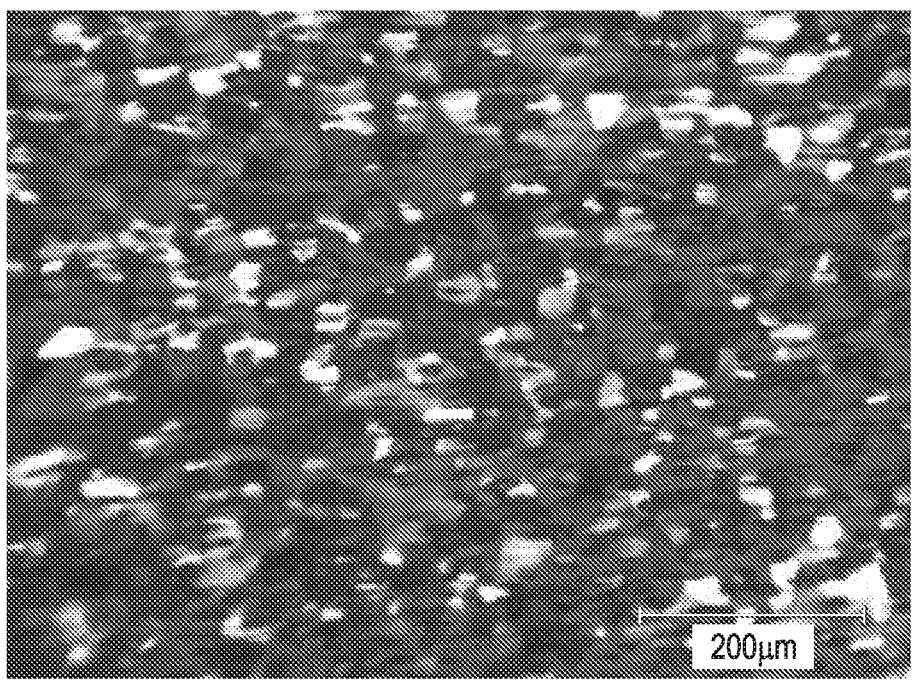
FIGS. 4A to 4E are images from an electron microscope, comparing grain sizes from an exemplary method of the current disclosure.

FIG. 4A shows the grain structure at ×100 magnification after an 85-90% height reduction with FF at room temperature, followed by a 52% height reduction with rolling at 250° C., resulting in an average grain size of 25.5 μm.

Figure 4B:
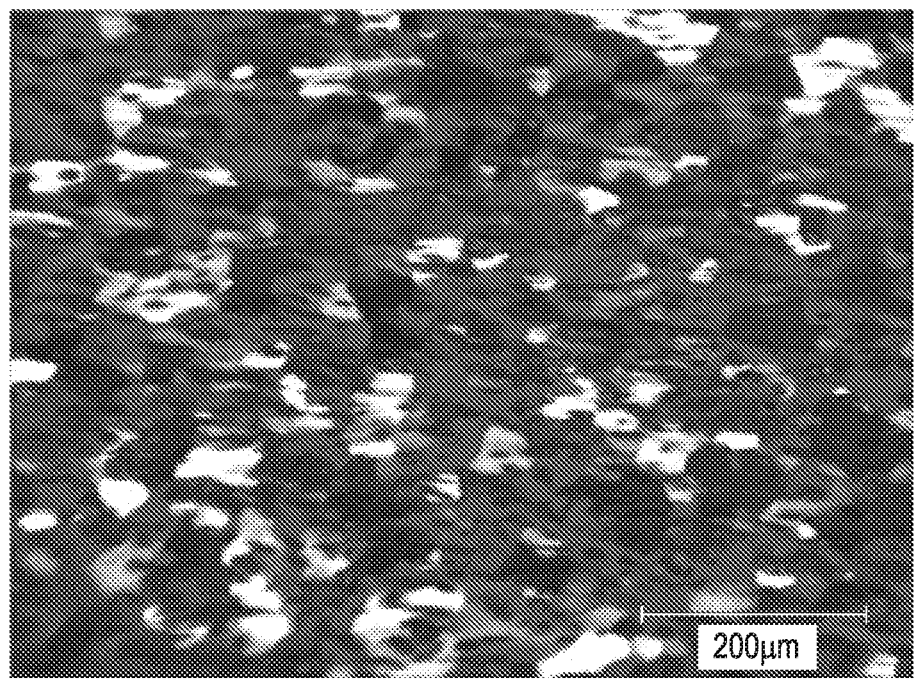

FIG. 4B shows the grain structure at ×100 magnification after a 70% height reduction with FF at room temperature, followed by a 61.5% height reduction with rolling at 250° C., resulting in an average grain size of 32.5 μm.

Figure 4C:
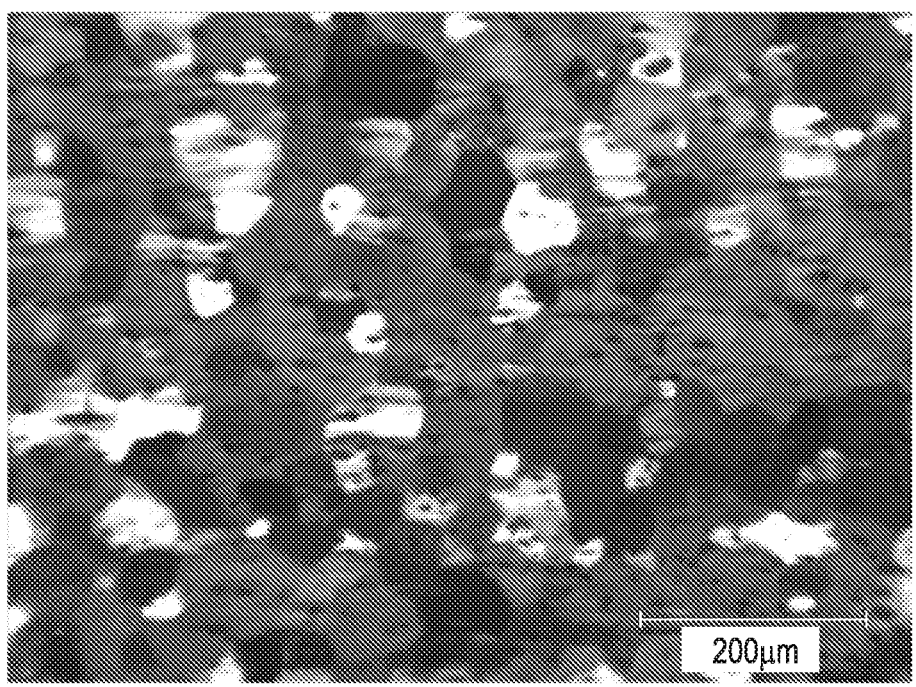

FIG. 4C shows the grain structure at ×100 magnification after an 85-90% height reduction with FF at room temperature, followed by a 52% height reduction with rolling at 300° C., resulting in an average grain size of 41.75 μm.

Figure 4D:
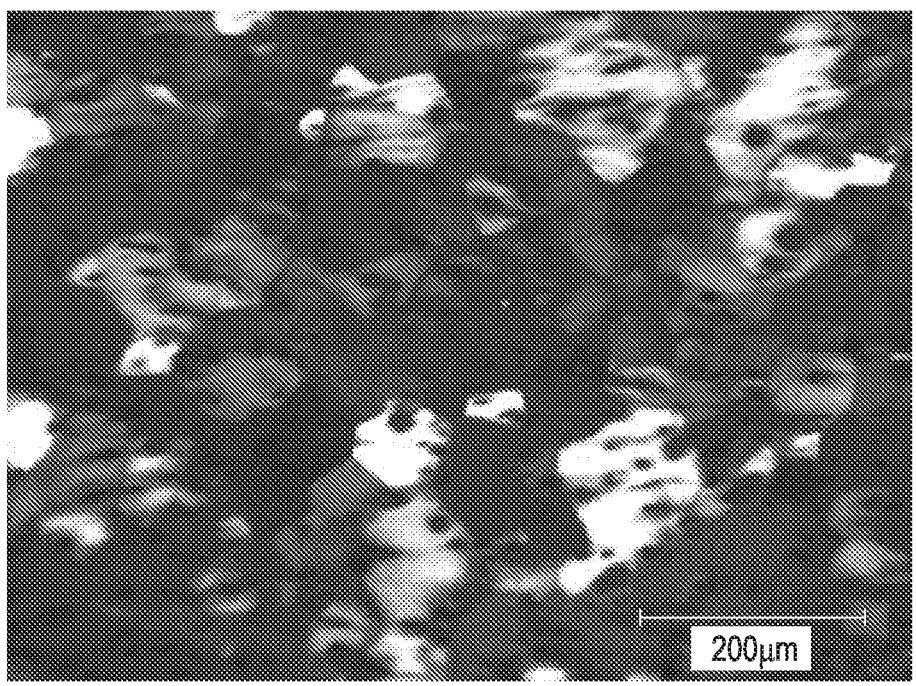

FIG. 4D shows the grain structure at ×100 magnification after a 70% height reduction with FF at room temperature, followed by a 61.5% height reduction with rolling at 300° C., resulting in an average grain size of 50 μm.

Figure 4E:
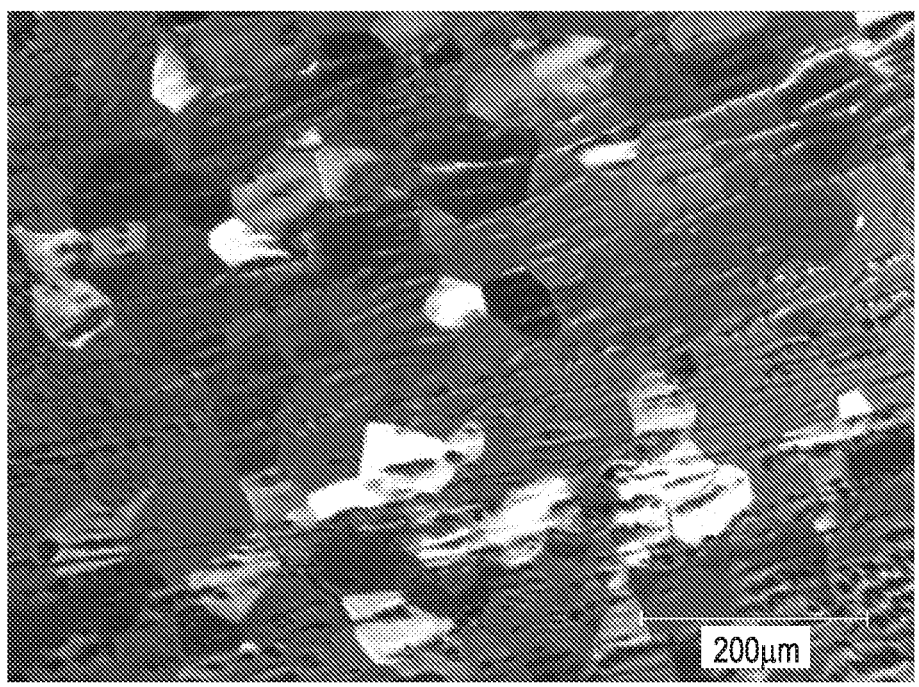

FIG. 4E shows the grain structure at ×100 magnification after an 85-90% height reduction with FF at room temperature, with no rolling, resulting in an average grain size of 48 μm.

Overall, moderate rolling is advantageous after room temperature FF. It allows the use of smaller FF reductions yet still provides fine uniform grain structure after heat treatment up to bonding conditions.

Example 4

Large Scale Frictionless Forged Prototypes and Trials: Comparing Two Processes with Frictionless Forging and Rolling Based on the results of Examples 1-3 using small scale trials, the following two large scale samples were manufactured. Target A was FF to a 52.5% height reduction (from 6 inches to 2.85 inches in height) at room temperature followed by a 75% height reduction using cross-rolling along 4 directions (from 2.85 inches to 0.7 inches) at room temperature. Target B: was FF to a 74% height reduction (from 6.0 inches to 1.58 inches in height) at room temperature followed by a 55% height reduction using cross-rolling along 4 directions (from 1.58 inches to 0.7 inches) at room temperature. See Table 5 below.

TABLE 5

Comparison of Percent Billet Height Reduction For 3 Studied Processes.

|  | Total percent height reduction | Initial Height (in.) | Final Height (in.) | Process used |
|---|---|---|---|---|
| Baseline | 88% | 6 | 0.7 | 88% cross-roll |
| TARGET A | 88% | 6 | 0.7 | 52.5% FF and 75% cross-roll |
| TARGET B | 88% | 6 | 0.7 | 74% FF and 55% cross-roll |

Note that for both Target A and Target B the total amount of strain is the same since the initial and final heights are the same for both targets, as summarized in Table 5. Also note that the processing parameters for Target B, with a 74% FF height reduction is at the high end of the loading capabilities of the forging press and is therefore more difficult to carry out than the parameters for Target A. All else being equal, if given a choice, it would typically be easier to attain the processing parameters used for Target A.

Both samples were diffusion bonded to a 300 mm diameter backing plate for the same time and temperature: 300° C. for longer than two hours. After the backing plate bonding step, the grain sizes were evaluated using optical microscopy both along the top surface at 49 locations and at a through thickness at 9 locations.

Figure 5:
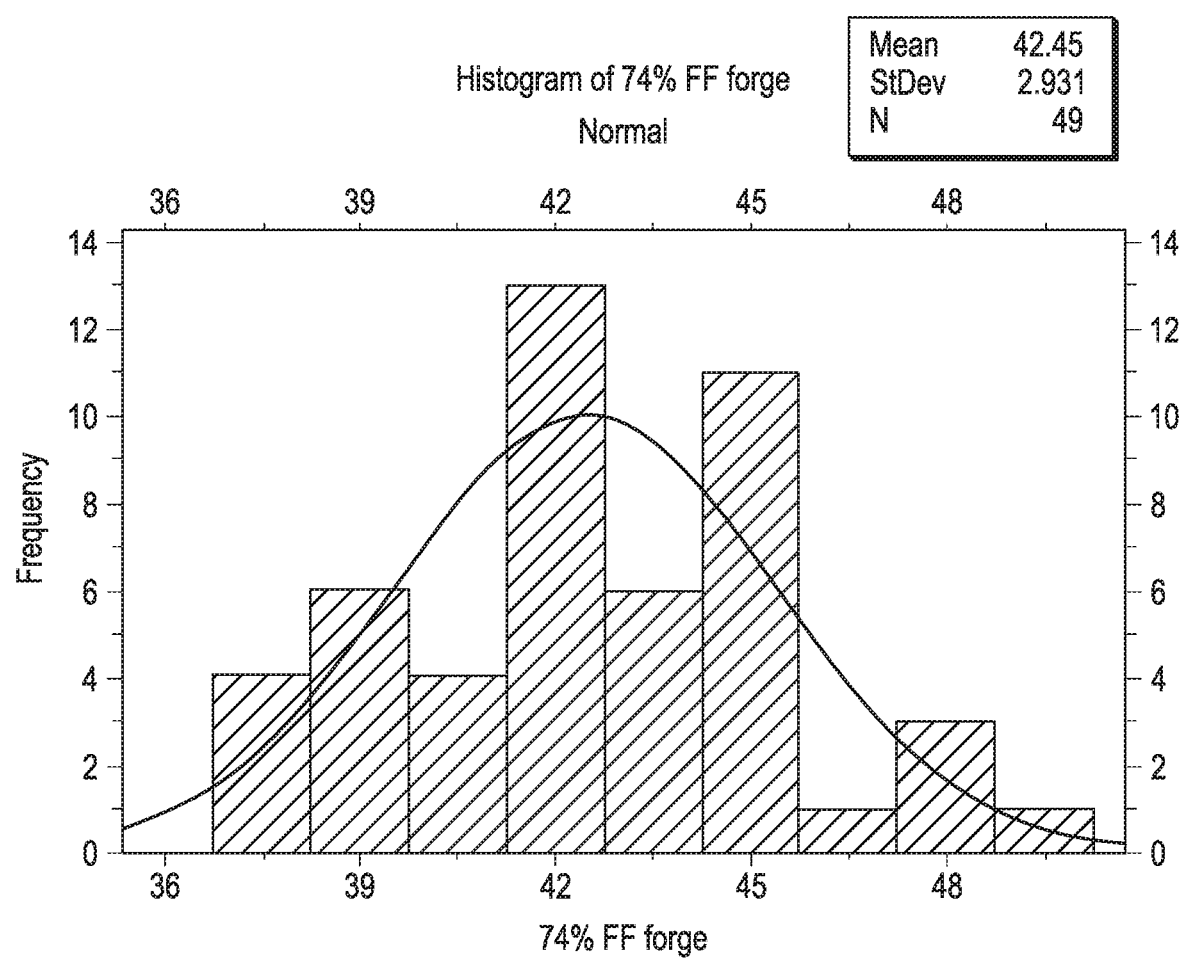
FIG. 5 is an image of a histogram of grain size, illustrating the statistical results of a method of the current disclosure.
Figure 6:
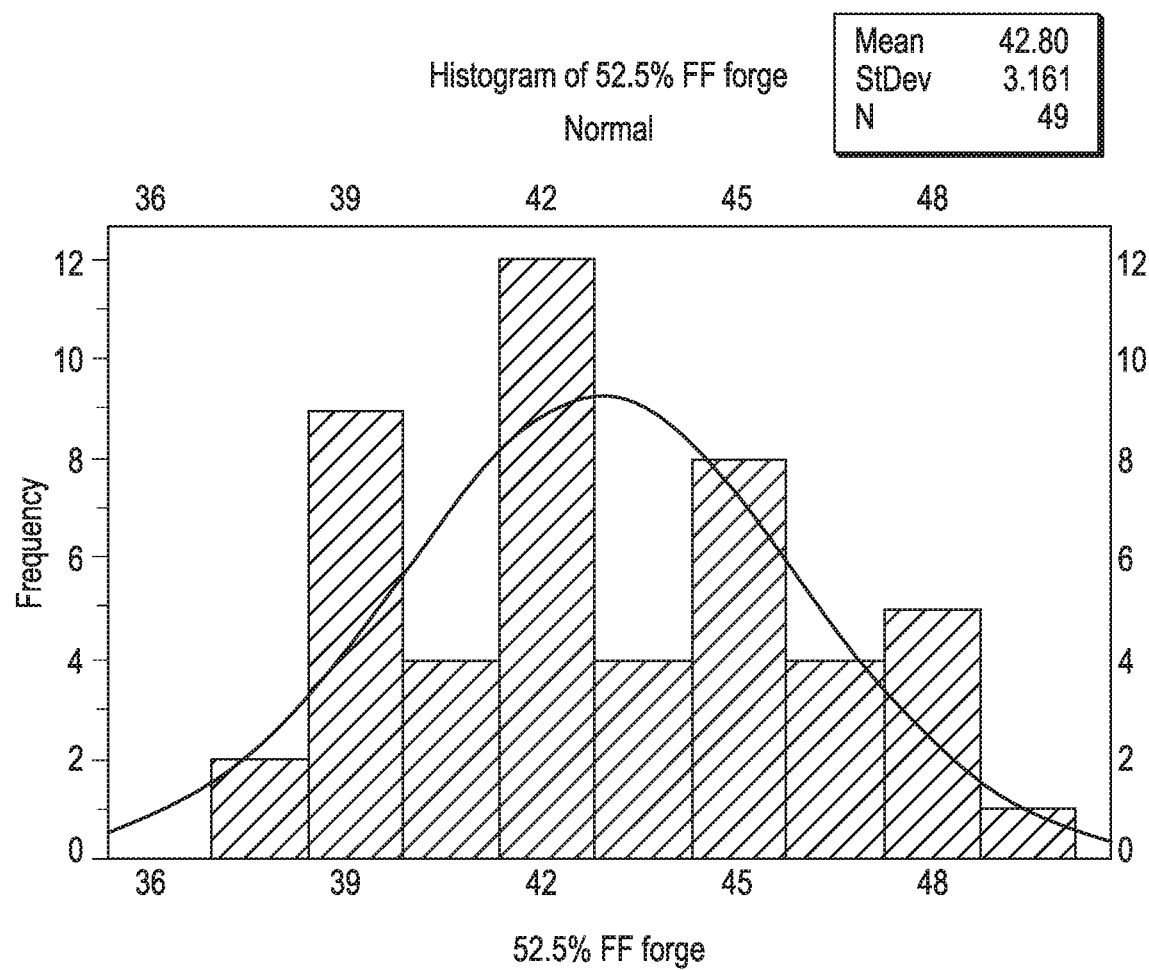
FIG. 6 is an image of a histogram of grain size, illustrating the statistical results of a method of the current disclosure.
Figure 7:
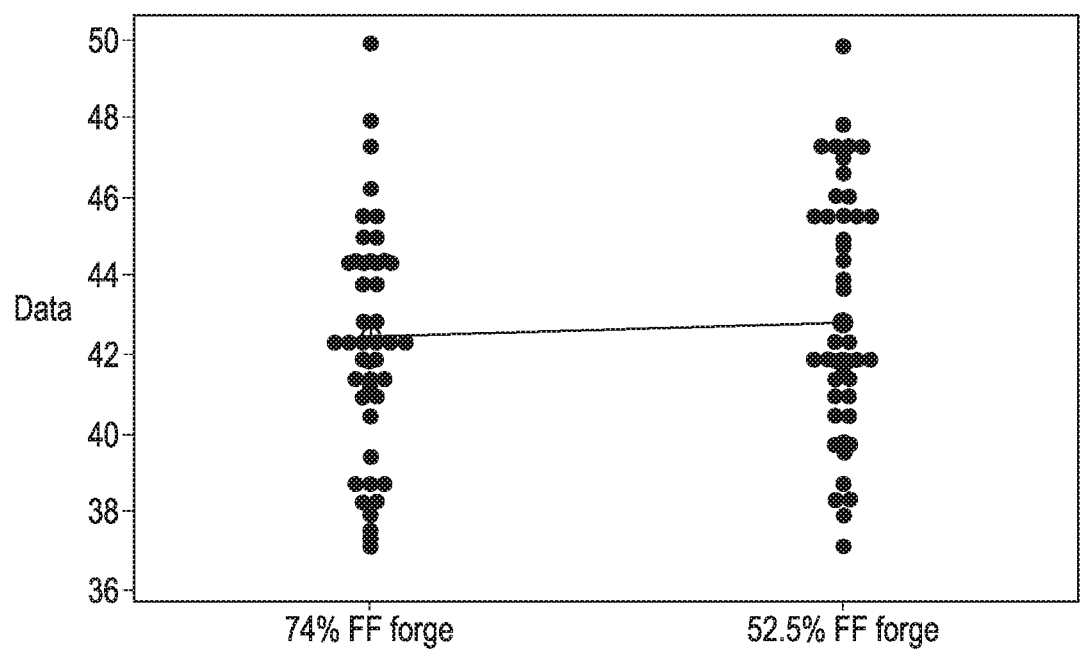
FIG. 7 is an image illustrating grain size statistical data from a comparison of two samples made with the methods of the current disclosure.

Statistical analysis was conducted for data collected along the top plane at 49 locations. FIG. 5 and FIG. 6 give the statistical data. FIG. 7 and table 6 provide the direct statistical comparison (t test) between both processes.

TABLE 6

Data For FIG. 7. Two-Sample T-Test for 75% FF vs. 50% FF

| Sample | N | Mean | StDev | SE Mean |
|---|---|---|---|---|
| 74% FF Forge | 49 | 42.45 | 2.931 | .42 |
| 52.5% FF Forge | 49 | 42.80 | 3.161 | .45 |

TABLE 6-continued

Data For FIG. 7. Two-Sample T-Test for 75% FF vs. 50% FF

| Sample | N | Mean | StDev | SE Mean |
|---|---|---|---|---|

Difference = mu (74% FF Forge) − mu (52.5% FF Forge)
Estimate for difference: −0.347
95% CI for difference: (−1.569, 0.876)
T-Test of difference = 0 (vs not =): T-Value = −0.56 P-Value = 0.575 DF = 95

In summary, the mean values (42.45 & 42.80 µm) and standard deviations (2.931 & 3.161 µm) are very similar. The P value as displayed in Table 6 is P=0.575 which is well over the threshold value of 0.05 (i.e. 0.575 is much greater 0.05). What this data indicates is that there is no statistical difference between Target A and Target B for grain sizes at the target surface (with a 95% confidence level).

Figure 8:
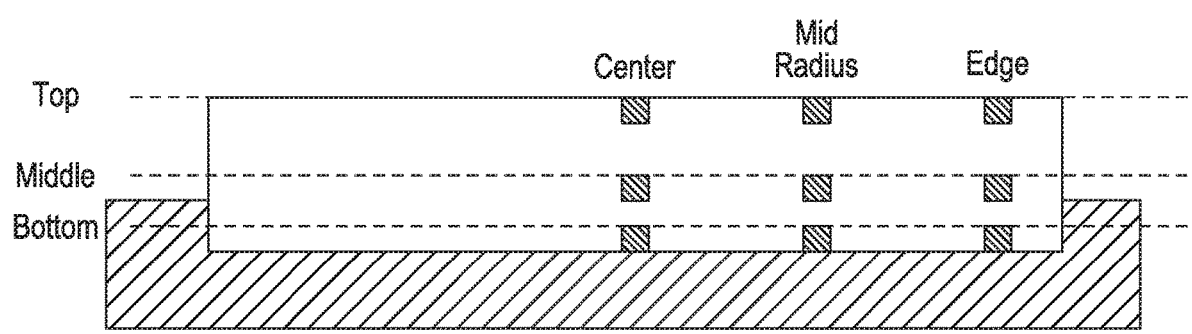
FIG. 8 is an image illustrating the locations of samples taken for testing from a material processed according to the methods of the current disclosure.

The grain sizes along the cross section through the target thickness were measured at 9 locations near the top, middle and bottom thickness of the blanks at 3 target radii (center, mid-radius, edge). See FIG. 8. The data, contained in Table 7 show a close similarity in grain size data between the large scale process and prototypes of Example 1-3.

TABLE 7

Data For Example 4 Cross Sectional Area Grain Size Measurements

| | | 52.5% FF height reduction and 75% rolling height reduction | | | 74% FF height reduction and 55% rolling height reduction | | |
|---|---|---|---|---|---|---|---|
| | | EDGE | MID RAD | CENTER | EDGE | MID RAD | CENTER |
| CROSS SECTION | TOP | 37.5 | 38.3 | 39.8 | 38.4 | 36.04 | 38.1 |
| | MIDDLE | 37.1 | 40.0 | 40.8 | 39.6 | 39.9 | 39.5 |
| | BOTTOM | 37.5 | 39.8 | 40.1 | 49.0 | 40.2 | 41.3 |
| | Mean/column | 37.4 | 39.4 | 40.2 | 42.3 | 38.7 | 39.6 |
| | Mean GS | 39.0 | | | 40.2 | | |
| | Std Dev | 1.4 | | | 3.6 | | |

Note that the cross-sectional data have a smaller mean grain size (39 & 40.2 microns) than at the top surface (42.45 & 42.80 microns). This may be due to the slightly more elongated shape of grains when observed along the cross sectional thickness. Based on the grain size results, it may be advantageous to use a FF process with a lower percent reduction such as 50-60% in order to simplify the process.

Example 5

Comparison of Large Scale Frictionless Forging Vs Baseline Process: Grain Size at Top Face as Measured by Optical Microscopy The baseline process often used in production for Al0.5Cu targets consists of casting of a cylindrical billet followed by cross-rolling and then machining and bonding. Cross rolling is performed at room temperature for a typical height reduction of 88% (from 6.0 inch height to 0.70 inches) as shown above in Table 5. The cross-roll pattern uses 4 equally spaced rolling directions. Four baseline targets were completed and analyzed by optical microscopy to measure grain size at the top surface at 49 locations. These targets were compared with the two FF and rolled prototypes discussed in Example 4.

Figure 9:
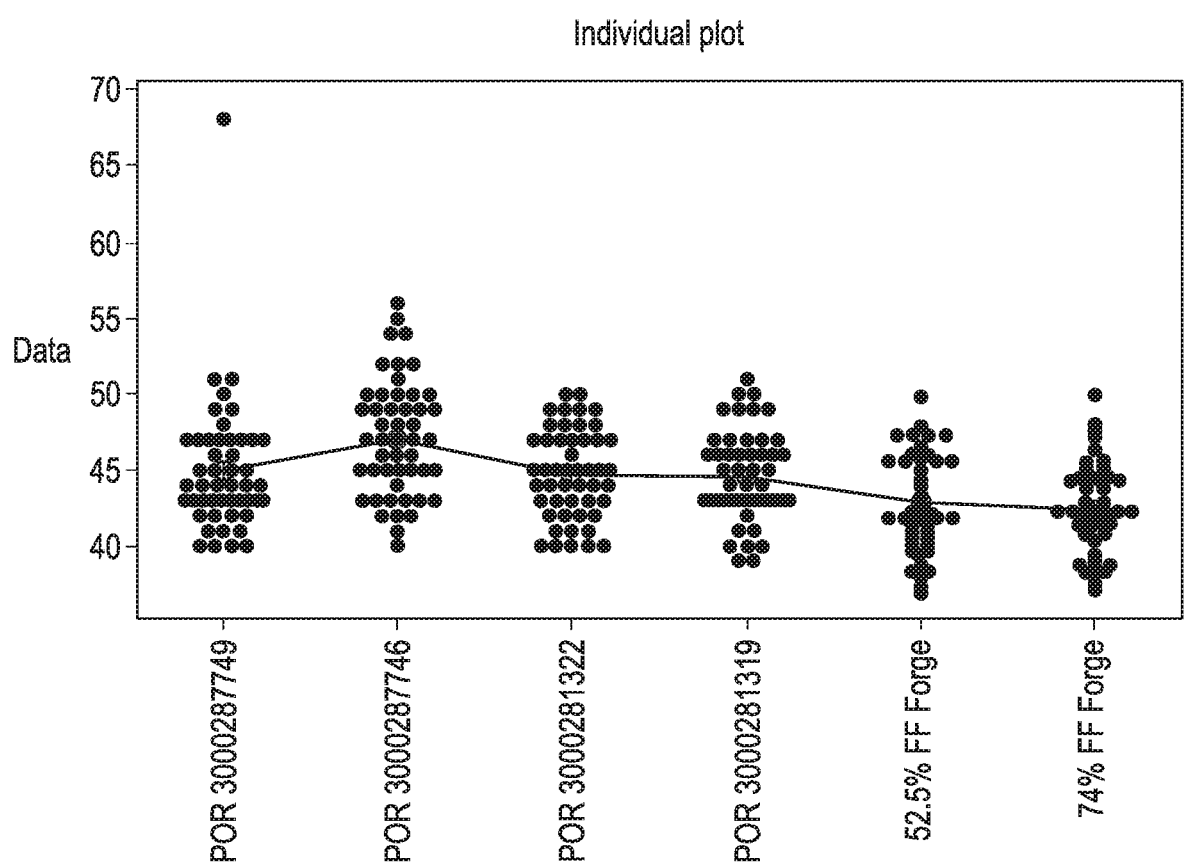
FIG. 9 is an image illustrating statistical data from a comparison of baseline samples and samples made with the methods of the current disclosure.
Figure 10:
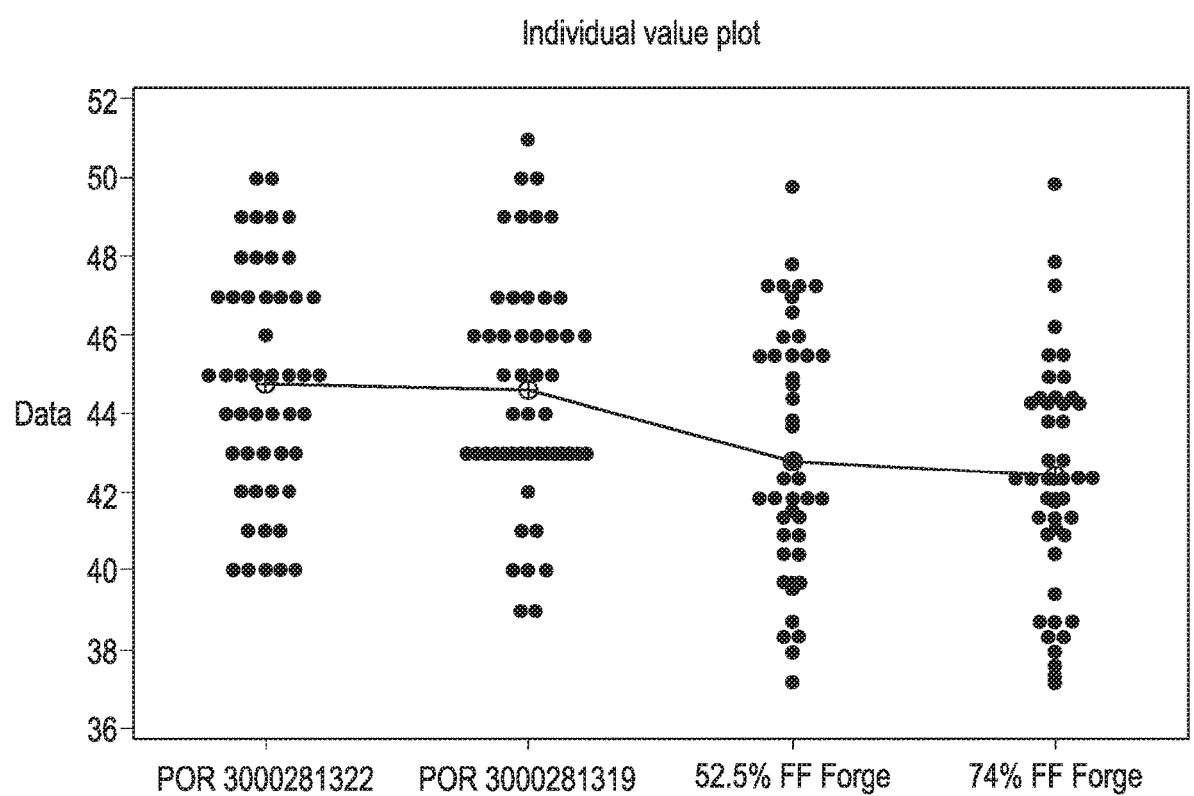
FIG. 10 is an image illustrating statistical data from a comparison of baseline samples and samples made with the methods of the current disclosure.

Table 8 displays the data collected from the comparison of the baseline material and the inventive examples. FIG. 9 shows statistical analysis (ANOVA) between the 4 baseline targets and the two FF and rolled targets. FIG. 10 shows the statistical analysis (ANOVA) between the 2 best baseline targets and the two FF and rolled samples. Tables 9 and 10 contain the statistical data shown in FIGS. 9 and 10 respectively.

TABLE 8

Grain Size Comparison For Baseline Material and Frictionless Forge Material

| | Baseline Process | | | | 52.5% Height Reduction From FF | 74% Height Reduction From FF |
|---|---|---|---|---|---|---|
| | target 1 | target 2 | target 3 | target 4 | | |
| Grain Size (microns) | 44.94 | 47.16 | 44.76 | 44.61 | 42.8 | 42.45 |
| Standard Deviation | 4.413 | 3.82 | 2.926 | 2.949 | 3.161 | 2.931 |

TABLE 9

Statistical Data For FIG. 9.

| Source | DF | SS | MS | F | P |
|---|---|---|---|---|---|
| Factor | 5 | 708.6 | 141.7 | 12.16 | 0.000 |
| Error | 288 | 3356.2 | 11.7 | | |
| Total | 293 | 4064.8 | | | |

S = 3.414 R-Sq = 17.43% R-Sq(adj) = 16.00%

TABLE 10

Statistical Data For FIG. 10.

| Source | DF | SS | MS | F | P |
|---|---|---|---|---|---|
| Factor | 3 | 211.67 | 70.56 | 7.87 | 0.000 |
| Error | 192 | 1720.68 | 8.96 | | |
| Total | 195 | 1932.35 | | | |

S = 2.994 R-Sq = 10.95% R-Sq(adj) = 9.56%

Overall the two FF and rolled targets have smaller average grain sizes by about 2 to 5 microns and similar standard deviation. ANOVA analysis indicates that the difference in grain size is significant with P value P=0.00 which is less than the threshold of 0.05. This is the case even when comparing the two best baseline targets from FIG. 10 to the FF ones.

Example 6

Comparison of Large Scale Frictionless Forged Material to Baseline Process: Optical Microscopy and EBSD Analysis of Grain Size and Texture Five baseline targets were produced using the standard baseline process described in Example 5. These five baseline targets were compared to the two large scale FF samples of Examples 4 and 5 (Targets A and B) by using cross-sectional optical microscopy and EBSD.

Figure 11:
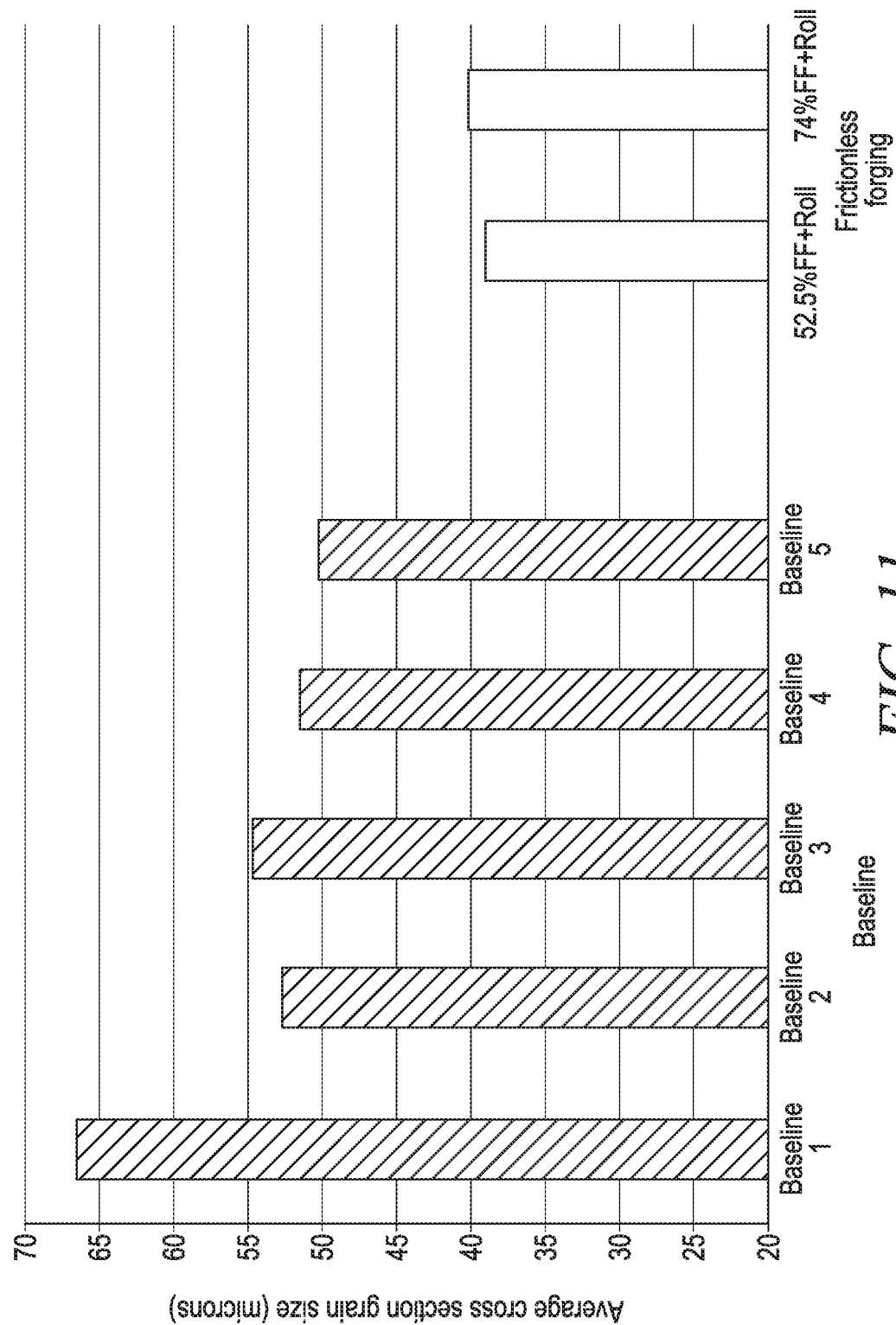
FIG. 11 are images illustrating grain size data from a comparison of baseline samples and samples made with the methods of the current disclosure.

The five baseline targets were used in a sputtering process and were either found to have performed poorly (the samples labeled target #1, #2, #3, and #5) or performed adequately (the sample labeled target #4). Table 11 and FIG. 11 show the cross-section grain size as measured by optical microscopy. The baseline targets that were noted to have performed poorly (the samples labeled target #1, #2, #3, #5) have larger mean grain size and worse uniformity than the baseline target that performed adequately (the sample labeled target #4), especially at half thickness. These two parameters indicate what may contribute to the poor performance. In comparison, the data for the FF and rolled samples fall on the low side of grain size range and average compared to either the poor or adequate baseline targets.

TABLE 11

Grain Size of Cross Section by Optical Microscopy

| Location | Baseline: 90% Height Reduction Rolling | | | | | FF Height Reduction | |
|---|---|---|---|---|---|---|---|
| | Poor Performance | | | | Adequate | 52.5% FF with roll | 74% FF with roll |
| | #1 | #2 | #3 | #5 | #4 | | |
| Top | 52 | 63 | 57 | 65 | 51 | 38.5 | 37.5 |
| Middle 1 | 76 | 51 | 46 | 45 | 52 | 39.3 | 39.7 |
| Middle 2 | 79 | 51 | 76 | 55 | | | |
| Bottom | 59 | 46 | 40 | 36 | 51.5 | 39.1 | 43.5 |
| Average | 66.5 | 52.75 | 54.75 | 50.25 | 51.5 | 39 | 40.2 |

Figure 12A:
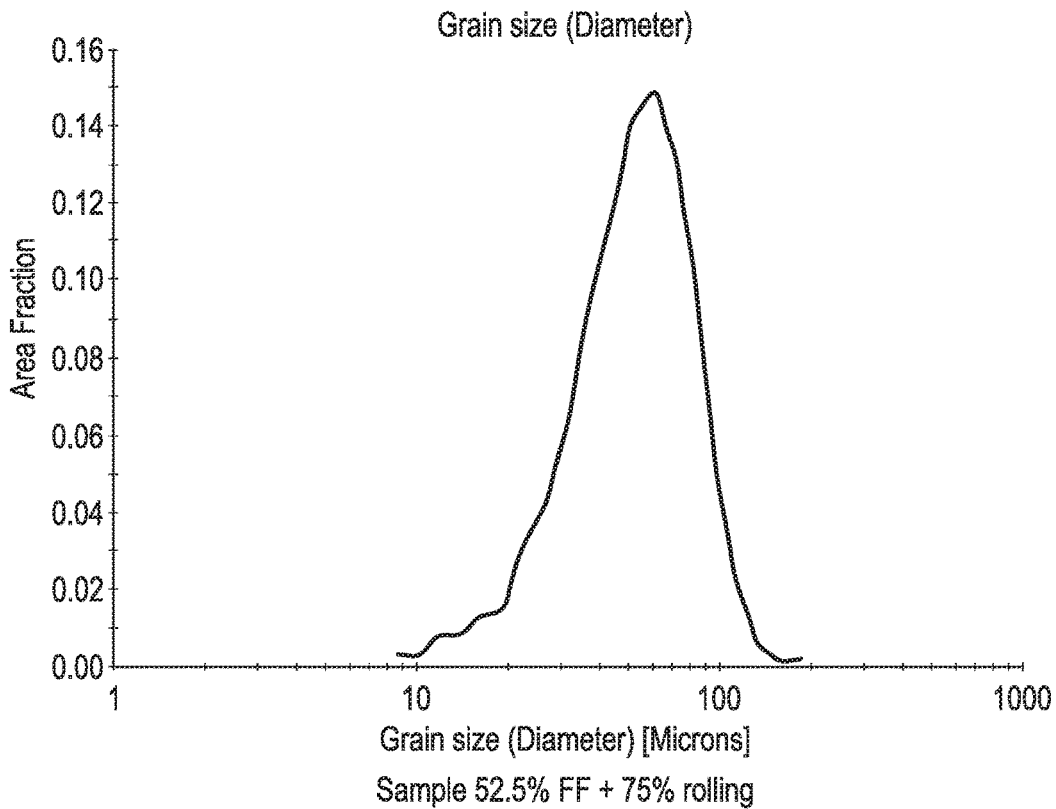
FIGS. 12A and 12B are images illustrating data on grain size distribution from samples made with the methods of the current disclosure.
Figure 12B:
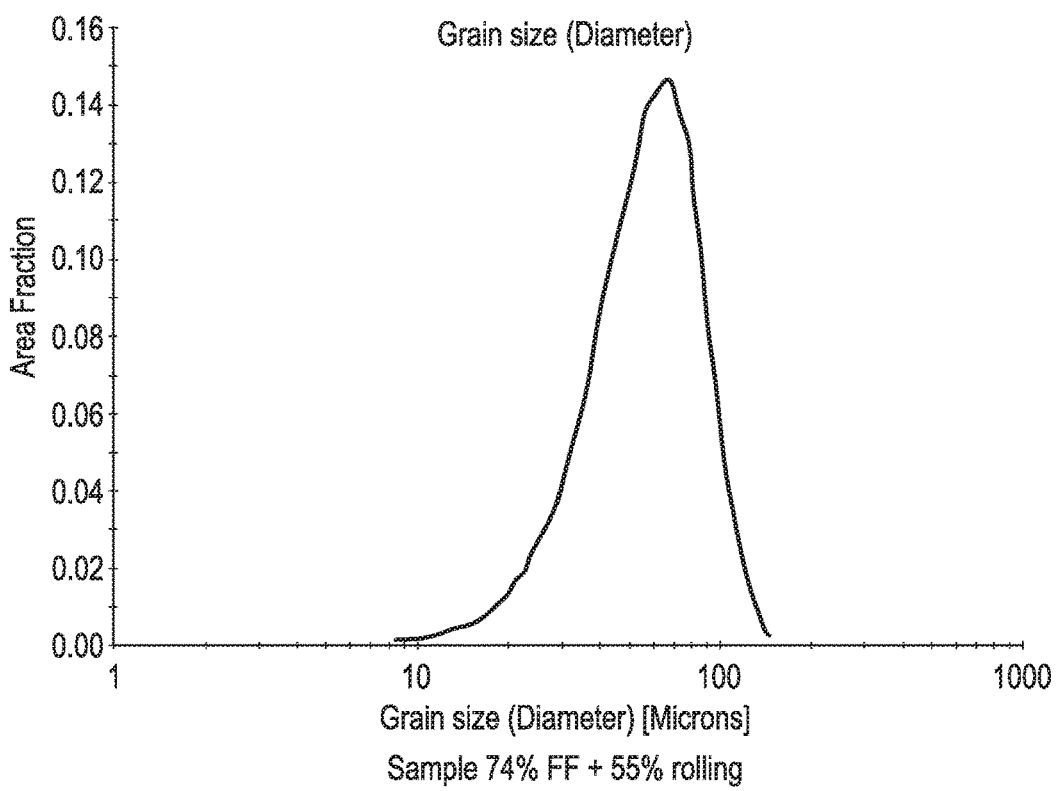

The data on grain size obtained by optical microscopy was confirmed by EBSD analysis of the cross section through the full target thickness. As shown in Table 12 below, the two FF targets have lower mean grain size and similar standard deviation. FIGS. 12A and 12B show the distribution in grain size, and Tables 13 and 14 contain the data used to create FIGS. 12A and 12B respectively. As shown in FIGS. 12A and 12B, a Gaussian distribution is present, indicating good uniformity.

TABLE 12

Average Grain Size and Standard Deviation

| | Sample | Average Grain Size (microns) - EBSD | STD Dev (microns) - EBSD |
|---|---|---|---|
| Baseline | 1 | 54.4 | 29.9 |
| | 2 | 38 | 20.63 |
| | 3 | 43.4 | 24.3 |
| | 5 | 36.7 | 20 |

TABLE 12-continued

Average Grain Size and Standard Deviation

| | Sample | Average Grain Size (microns) - EBSD | STD Dev (microns) - EBSD |
|---|---|---|---|
| FF | 52.5% FF with rolling | 31.37 | 19.71 |
| | 74% FF with rolling | 36.68 | 21.05 |

TABLE 13

Data For FIG. 12A.
Chart: Grain Size (Diameter)
Edge grains included in analysis

| Diameter (microns) | Number |
|---|---|
| 8.652 | 2250 |
| 10.17 | 1262 |
| 11.96 | 2433 |
| 14.06 | 1692 |
| 16.53 | 1980 |
| 19.44 | 1626 |
| 22.85 | 2636 |
| 26.87 | 2443 |
| 31.59 | 2681 |
| 37.14 | 2910 |
| 43.67 | 2609 |
| 51.34 | 2262 |
| 60.36 | 1716 |
| 70.97 | 1114 |
| 83.44 | 587 |
| 98.10 | 218 |
| 115.3 | 63 |
| 135.6 | 11 |
| 159.4 | 2 |
| 187.5 | 2 |
| Average Number | 31.3716 |
| Standard Deviation Number | 19.7159 |

Sample 52.5% FF + 75% rolling

TABLE 14

Data For FIG. 12B.
Chart: Grain Size (Diameter)
Edge grains included in analysis

| Diameter (microns) | Number |
|---|---|
| 8.594 | 1057 |
| 9.969 | 682 |
| 11.56 | 1011 |
| 13.41 | 1445 |
| 15.56 | 1212 |
| 18.05 | 1656 |
| 20.94 | 1944 |
| 24.29 | 2363 |
| 28.18 | 2284 |
| 32.69 | 2717 |
| 37.92 | 2821 |
| 43.98 | 2830 |
| 51.02 | 2587 |
| 59.19 | 2204 |
| 68.66 | 1706 |
| 79.65 | 1083 |
| 92.39 | 520 |
| 107.2 | 180 |
| 124.3 | 54 |
| 144.2 | 4 |
| Average Number | 36.6874 |
| Standard Deviation Number | 21.0542 |

Sample 74% FF + 55% rolling

Figure 13A:
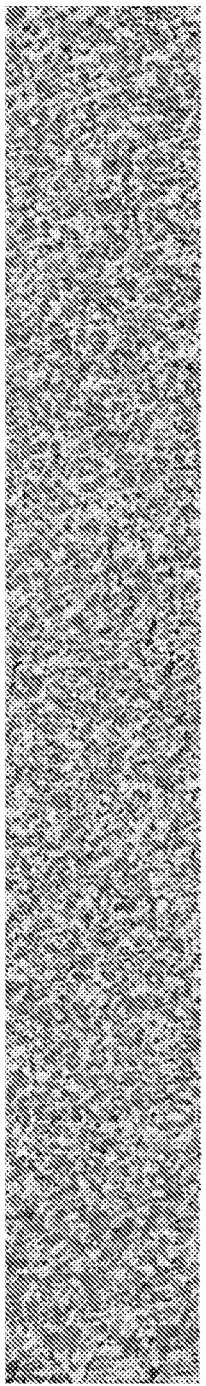
FIGS. 13A and 13B are images of two materials processed with the methods of the current disclosure, illustrating grain size distribution.
Figure 13B:
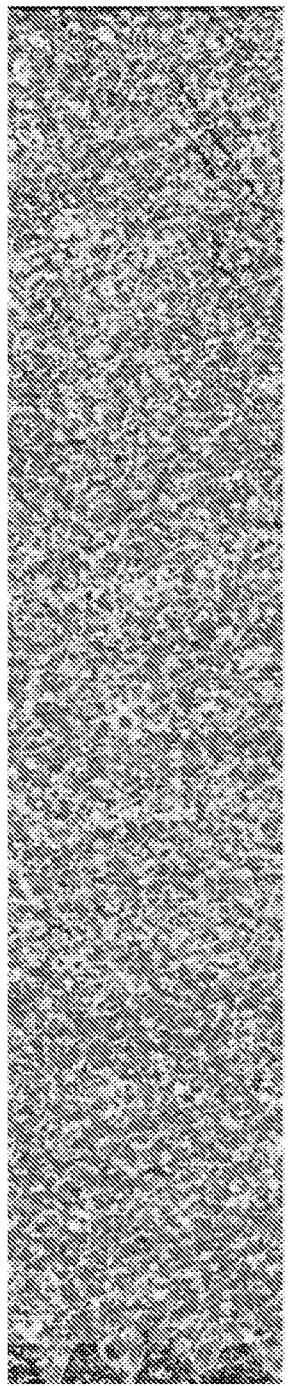

FIGS. 13A and 13B illustrate a map for grain size and texture of the two FF samples respectively. The map reveals a homogenous grain size and texture with no group of groups of large grains and no group of grains with a similar texture, i.e. no grain banding. EBSD confirms that FF prototype parts show a uniform grain size distribution with an average grain size on the low range of the historical value.

For these examples, EBSD allows for further comparison between FF and baseline targets. As displayed in Table 15, the values of B and H for the two FF samples are lower than those of the five baseline targets. B values for FF samples are near 0 (0.001 and 0.003) confirming the absence of banding. H values for FF pieces are 0.114 and 0.110 compared to a higher range of 0.195-0.275 for the five baseline targets.

TABLE 15

Banding Factor and Homogeneity Values for Baseline and Inventive Examples

| | Baseline: 90% Rolling Height Reduction | | | | Frictionless Forging | |
|---|---|---|---|---|---|---|
| | Poor Performance | | | Adequate | 52.5% FF | 74% FF |
| Location | Targets | | | | | |
| | #1 | #2 | #3 | #5 | forge + roll | forge + roll |
| Uniformity Factor H | 0.26 | 0.194 | 0.275 | 0.195 | 0.114 | 0.11 |
| Banding Factor B | 0.01 | 0.055 | 0.006 | 0.001 | 0.001 | 0.003 |

Figure 15:
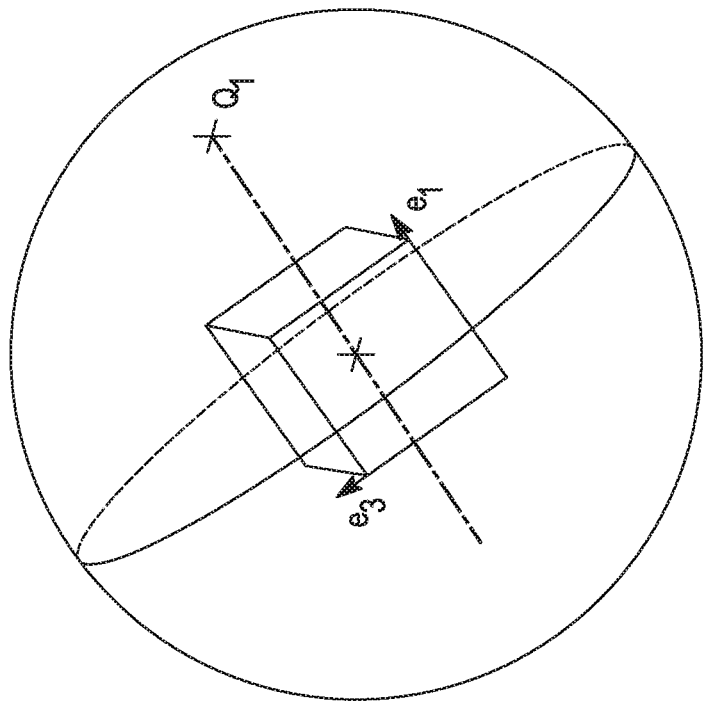
FIG. 15 is an image illustrating pole orientations in three dimensional space.
Figure 15:
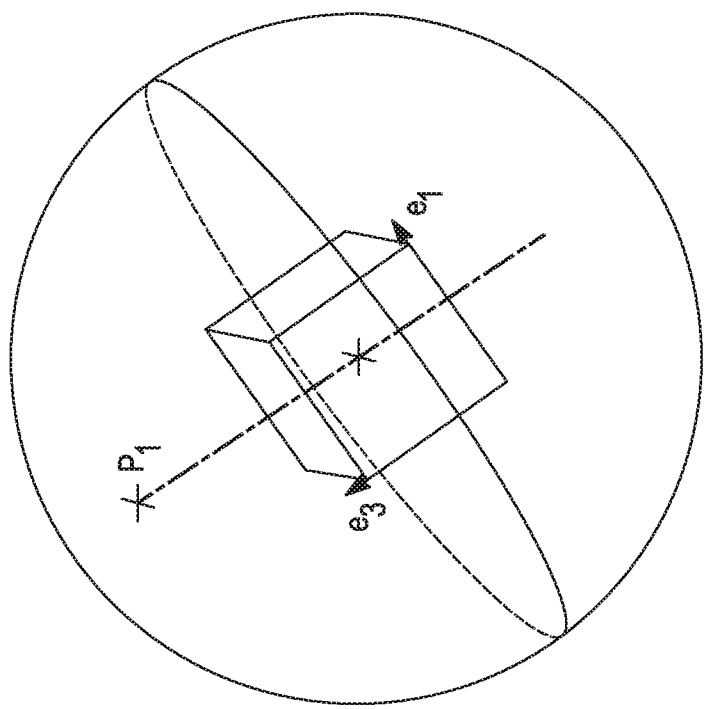

Texture strength and orientation were also analyzed with EBSD. Texture strength was evaluated by measuring the maximum intensity of pole figures and inverse pole figures. A pole figure is a graphical representation of the orientation of objects in space. For example, pole figures in the form of stereographic projections are used to represent the orientation distribution of crystallographic lattice planes in crystallography and texture analysis in materials science. As shown in FIG. 15, the pole figure plots the orientation of a given plane normal with respect to the sample reference frame. Inverse pole figure are also a graphical representation of objects in space. For the inverse pole figure, the focus is on a specific sample plane such as a sample normal plane, and finding which crystal plane is parallel to this specified sample plane.

To define orientation and pole, consider an object with a reference basis attached to it. The orientation of the object in space can be determined by three rotations to transform the reference basis of space to the basis attached to the object; these are the Euler angles. If one considers a plane of the object, the orientation of the plane can be given by its normal line. If we draw a sphere with the center on the plane, then the intersection of the sphere and the plane is a circle, called the "trace" and the intersection of the normal line and the sphere is the pole, as shown in FIG. 15.

A single pole is not enough to fully determine the orientation of an object: the pole stays the same if a rotation is applied around the normal line. The orientation of the object is fully determined by the use of poles of two planes that are not parallel. By definition, the pole figure is the stereographic projection of the poles used to represent the orientation of an object in space.

Table 16 compares data for the maximum intensity. One times random (t.r.) corresponds to a perfectly random texture when crystallographic orientations are shared equally between grains and there is no preferred orientation. Intensity is measured in multiples of random intensity (times random or t.r.). Typically values between 1 and 3 t.r correspond to weak texture, values between 3 and 6 t.r. to medium textures and values over 6 t.r. and, especially over 10 t.r., to strong or very strong textures where a few main orientations dominate.

TABLE 16

Max intensity of Pole and Inverse Pole Figures and type of texture

| | | Texture Strength | | |
|---|---|---|---|---|
| | Part | Max intensity of [001] Inverse Pole Figure (times random) | Max intensity of Pole Figure (times random) | Texture orientation |
| Baseline | 1 | 1.925 | 3.032 | weak/medium (200) |
| | 2 | 2.141 | 2.714 | weak (200) |
| | 3 | 3.721 | 4.099 | weak/medium (200) |
| | 5 | 2.252 | 2.79 | weak (200) |
| FF forged | 52.5% FF + rolling | 1.892 | 2.29 | weak (200) |
| | 74% FF + rolling | 2.503 | 2.607 | weak (200) |

Table 16 indicates that FF targets have a weak texture with a max intensity less than 3 times random (range of 1.89 to 2.6 t.r.), which is on the low side of values for the five measured baseline targets (range 1.9 to 4.099 t.r.). Both the FF and baseline targets have a slightly higher level of (200) orientation when looking at texture of the plane parallel to the top surface (i.e. [001] inverse pole figure as shown in FIG. 14). This means that the top plane has a slightly higher number of grains with a (200) orientation while other orientations are distributed quite equally among remaining grains. The FF samples have however a slightly more uniform texture when measuring texture in 3 dimensions.

Table 17 displays texture strength and orientation along 3 perpendicular directions: the [001] direction that represents the normal of the plane parallel to the top surface of target as in FIG. 14 and Table 11 but also the [010] and [100] directions that are perpendicular to [100] and therefore represent planes perpendicular to the top surface of the target. FIG. 14 describes the different planes associated with [001], [010], and [100] directions. The FF and rolled targets show uniformly a weak (200) texture along all 3 directions whereas the baseline target (sample 1) has different weak textures along the two other directions ((212) & (112) along [010] plane and (112) & (103) along [100] plane). This level of textural uniformity has been shown to benefit sputtering performance.

TABLE 17

Texture along 3 directions

| | | | 52.5% FF and 75% rolling | | Sample 1 - Baseline | |
|---|---|---|---|---|---|---|
| | | | Max intensity of Inverse Pole Figure (times random) | Main orientation | Max intensity of Inverse Pole Figure (times random) | Main orientation |
| Plane Observed ([xyz] direction is normal to that plane) | [001] | [001] - Plane Parallel to top target face | 1.892 | weak (200) | 1.925 | weak (200) |
| | [010] | [010] - Through thickness plane perpendicular to target face (i.e. [001]) | 1.53 | weak (200) | 1.244 | weak (212) & (112) |
| | [100] | [100] - Through thickness - plane perpendicular to [001] and [010] planes | 1.375 | weak (200) | 1.387 | weak (112) & (103) |

In summary, the FF with rolling samples exhibit a more uniform weak texture as measured by H values and inverse pole figures along 3 directions and a less banded (lower B values) and finer grain structure compared to the baseline targets.

Various modifications and additions can be made to the exemplary embodiments discussed without departing from the scope of the present instant disclosure. For example, while the embodiments described above refer to particular features, the scope of this instant disclosure also includes embodiments having different combinations of features and embodiments that do not include all of the above described features.

The invention claimed is:

1. A sputtering target comprising:
a forged aluminum or aluminum alloy material having an average grain size between 15 and 55 microns, the aluminum or aluminum alloy material having:
a homogeneous texture with minimal texture banding as measured by a banding factor B below 0.005;
a texture gradient H of less than 0.2; and
a weak (200) texture characterized by a maximum intensity of inverse pole figure less than 3 times random in multiple directions.

2. The sputtering target of claim 1, wherein the aluminum or aluminum alloy material has the weak (200) texture in multiple directions, along planes parallel to a top surface of the target and thickness planes perpendicular to the top surface.

3. The sputtering target of claim 1, wherein the aluminum or aluminum alloy material has a maximum pole figure intensity below 3.5 times random.

4. The sputtering target of claim 1, wherein the aluminum or aluminum alloy material has a maximum pole figure intensity below 3.0 times random and an inverse pole figure intensity below 3.0 times random.

5. The sputtering target of claim 1, wherein the aluminum or aluminum alloy material has a texture gradient H less than 0.12.

6. The sputtering target of claim 1, wherein the aluminum or aluminum alloy material has a uniform average grain size distribution between 20 microns and 45 microns.

7. The sputtering target of claim 1, wherein the aluminum or aluminum alloy material has a homogeneous texture with minimal texture banding as measured by a banding factor B below 0.0025.

* * * * *